United States Patent
Liu

(10) Patent No.: US 10,419,701 B2
(45) Date of Patent: Sep. 17, 2019

(54) DIGITAL PIXEL IMAGE SENSOR

(71) Applicant: Facebook Technologies, LLC, Menlo Park, CA (US)

(72) Inventor: Xinqiao Liu, Medina, WA (US)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 15/847,517

(22) Filed: Dec. 19, 2017

(65) Prior Publication Data

US 2018/0376090 A1  Dec. 27, 2018

Related U.S. Application Data

(60) Provisional application No. 62/525,045, filed on Jun. 26, 2017.

(51) Int. Cl.
| | |
|---|---|
| *H04N 5/235* | (2006.01) |
| *H04N 5/378* | (2011.01) |
| *H04N 5/374* | (2011.01) |
| *G01J 1/44* | (2006.01) |
| *H04N 5/357* | (2011.01) |
| *H04N 5/3745* | (2011.01) |
| *H03K 5/24* | (2006.01) |

(52) U.S. Cl.
CPC .......... *H04N 5/378* (2013.01); *G01J 1/44* (2013.01); *H04N 5/2353* (2013.01); *H04N 5/3575* (2013.01); *H04N 5/374* (2013.01); *H04N 5/3745* (2013.01); *H03K 5/2481* (2013.01)

(58) Field of Classification Search
None
See application file for complete search history.

(56) References Cited

U.S. PATENT DOCUMENTS

| | | | |
|---|---|---|---|
| 8,134,623 B2 | 3/2012 | Purcell et al. | |
| 8,779,346 B2* | 7/2014 | Fowler | H04N 5/37455 250/208.2 |
| 9,094,629 B2 | 7/2015 | Ishibashi | |
| 9,363,454 B2* | 6/2016 | Ito | H04N 5/35554 |
| 2005/0057389 A1 | 3/2005 | Krymski | |

(Continued)

FOREIGN PATENT DOCUMENTS

EP   1746820 A1   1/2007

OTHER PUBLICATIONS

Cho, et al., "A Low Power Dual CDS for a Column-Parallel CMOS Image Sensor", Journal of Semiconductor Technology and Science, vol. 12, No. 4, Dec. 30, 2012, pp. 388-396.

(Continued)

*Primary Examiner* — Mark T Monk
(74) *Attorney, Agent, or Firm* — Kilpatrick Townsend & Stockton LLP

(57) ABSTRACT

Disclosed herein are techniques for digital imaging. A digital pixel image sensor includes a digitizer in each pixel of a plurality of pixels, where the digitizer digitizes analog output signals from a photodiode of the pixel using a comparator, a global reference ramp signal, and a clock counter. In some embodiments, the comparator includes a pre-charging circuit, rather than a constant biasing circuit, to reduce the power consumption of each pixel. In some embodiments, each pixel includes a digital or analog correlated double sampling (CDS) circuit to reduce noise and provide a higher dynamic range.

25 Claims, 17 Drawing Sheets

(56) References Cited

U.S. PATENT DOCUMENTS

| | | |
|---|---|---|
| 2007/0222881 A1 | 9/2007 | Mentzer |
| 2011/0254986 A1 | 10/2011 | Nishimura et al. |
| 2012/0262616 A1 | 10/2012 | Sa et al. |
| 2013/0057742 A1 | 3/2013 | Nakamura et al. |
| 2013/0299674 A1 | 11/2013 | Fowler et al. |
| 2015/0189209 A1* | 7/2015 | Yang .................. H04N 5/378 348/300 |
| 2015/0312502 A1 | 10/2015 | Borremans |
| 2016/0028974 A1 | 1/2016 | Guidash et al. |
| 2016/0100115 A1* | 4/2016 | Kusano ................ H03M 1/56 250/208.1 |
| 2016/0165160 A1* | 6/2016 | Hseih .................. H04N 5/363 348/308 |
| 2016/0360127 A1 | 12/2016 | Dierickx et al. |

OTHER PUBLICATIONS

European Application No. EP18179846.3, "Extended European Search Report", dated Dec. 7, 2018, 10 pages.
European Application No. EP18179851.3, "Extended European Search Report", dated Dec. 7, 2018, 8 pages.
International Application No. PCT/US2018/039350, "International Search Report and Written Opinion", dated Nov. 15, 2018, 13 pages.
International Application No. PCT/US2018/039431, "International Search Report and Written Opinion", dated Nov. 7, 2018, 14 pages.

\* cited by examiner

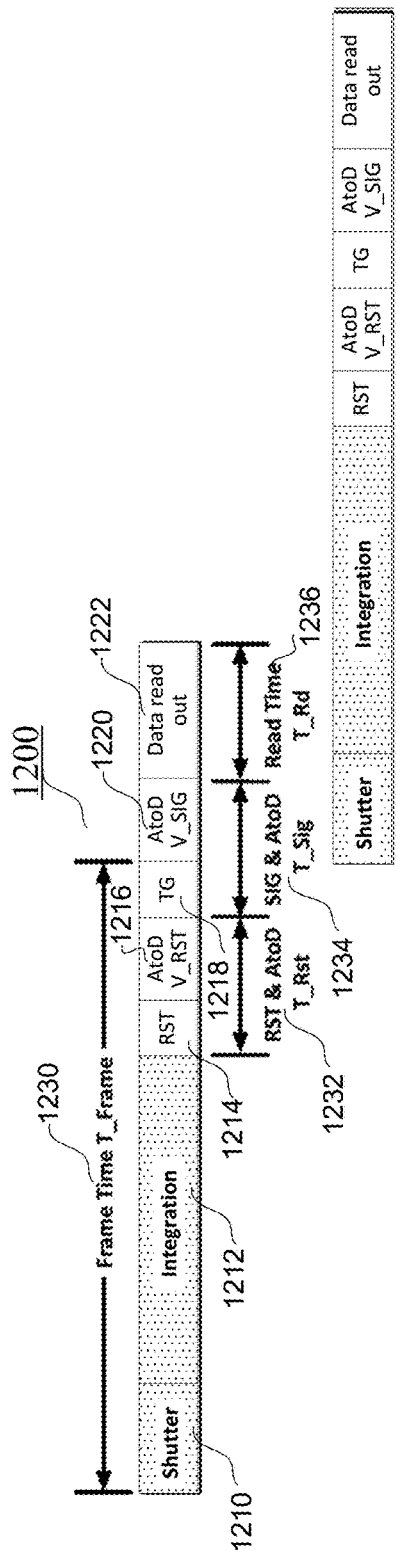
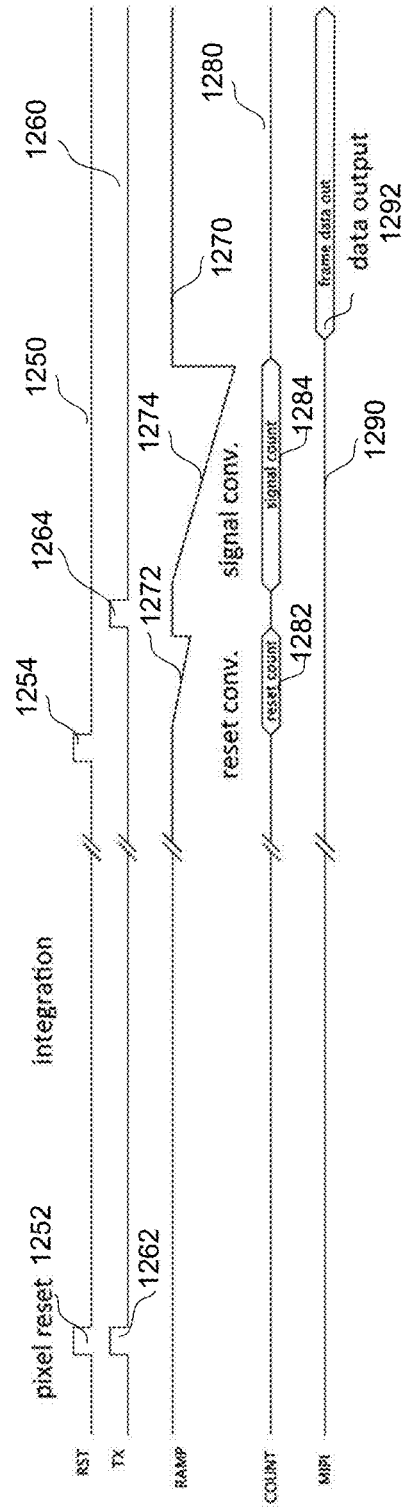
FIG. 12A
FIG. 12B

DIGITAL PIXEL IMAGE SENSOR

CROSS-REFERENCE TO RELATED APPLICATION

This patent application claims priority to U.S. Provisional Patent Application Ser. No. 62/525,045, filed Jun. 26, 2017, entitled "HIGH SPEED, HIGH DYNAMIC RANGE, LOW POWER MACHINE VISION SENSOR DEVELOPMENT," which is assigned to the assignee hereof and is herein incorporated by reference in its entirety for all purposes.

BACKGROUND

Image sensors are used in many different applications. For example, image sensors can be found in digital imaging devices (e.g., digital cameras, smart phones, etc.) to capture digital images. As another example, in artificial reality systems, such as virtual-reality (VR) systems, augmented-reality (AR) systems, and mixed reality (MR) systems, image sensors can be used to capture images of a physical environment in which a user is located, and the captured images may then be used to control or influence the operation of an artificial reality system, such as controlling or influencing the display content of the artificial reality system. An image sensor having a high speed, high sensitivity, high dynamic range, low noise, high density, high resolution, and low power consumption may be desired for many of these applications, including the artificial reality systems.

SUMMARY

This invention generally relates to digital pixel image sensors. More specifically, techniques disclosed herein relate to digital pixel image sensors including a digitizer (e.g., ADC) in each pixel, where the digitizer digitizes analog outputs from a photodiode of the pixel using a comparator, a reference ramp signal, and a counter. In some embodiments, each pixel may include a digital or analog correlated double sampling (CDS) circuit to reduce noise and provide a higher dynamic range. In some embodiments, the comparator may include a pre-charging circuit, rather than a constant biasing circuit, to reduce the power consumption of each digital pixel.

In some embodiments, a digital pixel image sensor nay include a plurality of pixels. Each pixel may include a photodiode configured to generate charges in response to an optical signal, and a charge storage device configured to store the charges generated by the photodiode, where the stored charges may cause a voltage signal on the charge storage device. Each pixel may also include a pixel memory and a digitizer. The digitizer may include a comparator configured to receive a ramp signal and the voltage signal, where a voltage level of the ramp signal increases or decreases after each cycle of a clock signal. The comparator may further be configured to change an output state of the comparator after the voltage level of the ramp signal reaches a voltage level of the voltage signal. The digitizer may also include a digital output generating circuit configured to, at a time when the output state of the comparator changes, receive a first number corresponding to a total number of cycles of the clock signal between a time when the ramp signal starts and the time when the output state of the comparator changes, and save the first number to the pixel memory, where the first number corresponds to a digitized value of the voltage level of the voltage signal.

In certain embodiments, a digital pixel for an image sensor may include a photodiode configured to generate charges in response to an optical signal, and a charge storage device configured to store the charges generated by the photodiode, where the stored charges may cause a voltage signal on the charge storage device. Each pixel may also include a pixel memory and a digitizer. The digitizer may include a comparator configured to receive a ramp signal and the voltage signal, where a voltage level of the ramp signal increases or decreases after each cycle of a clock signal. The comparator may further be configured to change an output state of the comparator after the voltage level of the ramp signal reaches a voltage level of the voltage signal. The digitizer may also include a digital output generating circuit configured to, at a time when the output state of the comparator changes, receive a first number corresponding to a total number of cycles of the clock signal between a time when the ramp signal starts and the time when the output state of the comparator changes, and save the first number to the pixel memory, where the first number corresponds to a digitized value of the voltage level of the voltage signal.

In certain embodiments, a method of digital imaging is disclosed. The method may include receiving a light signal by a photodiode of a pixel in an image sensor during an exposure period, and converting the light signal by the pixel into a voltage signal on a charge storage device of the pixel. The method may further include starting a clock counter that counts a number of clock cycles of a clock signal, and comparing the voltage signal and a ramp signal by a comparator of the pixel, where a voltage level of the ramp signal increases or decreases linearly with the number of clock cycles. The method may also include changing an output state of the comparator when the voltage level of the ramp signal reaches a voltage level of the voltage signal, and saving a first number corresponding to the number of clock cycles at a time when the output state of the comparator changes to a pixel memory of the pixel as a first digital value for the voltage signal.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures:

FIG. 12A illustrates example timing periods in example time frames for a global shutter digital pixel image sensor with a digital CDS circuit for each pixel, according to certain embodiments;

FIG. 12B is a timing diagram illustrating the operations of a digital pixel with a digital CDS circuit in a global shutter digital pixel image sensor, according to certain embodiments;

DETAILED DESCRIPTION

Figure 1A:
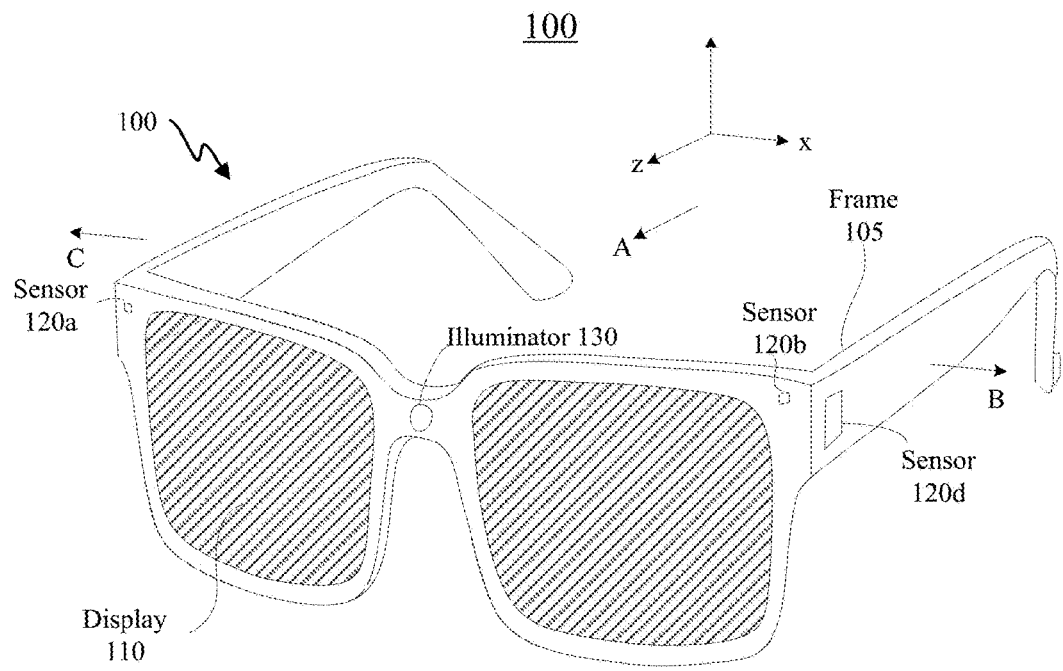
FIG. 1A is a perspective view of a simplified example near-eye display including various sensors, according to certain embodiments.

Disclosed herein are high speed, high resolution, high dynamic range, high sensitivity, and low power consumption images sensors. In various embodiments, digital pixel image sensors including a digitizer for each pixel may be used to achieve the desired performance. In some implementations, each digital pixel in a digital pixel image sensor may include a photodiode, a transfer gate, an analog storage device (e.g., explicit or parasitic capacitor), a digitizer (e.g., an ADC), and a digital memory. The photodiode may convert light signals into electrical signals. The transfer gate may be used to transfer the electrical signals (e.g., accumulated charges) from the photodiode to the analog storage device, and the digitizer may convert the electrical signals at the analog storage device to digital bits. The digital memory may store the digital bits before the digital bits are read out. In one example, the digitizer in each digital pixel may include a comparator. The comparator may compare the electrical signal at the analog storage device with a reference ramp signal. The reference ramp signal may be a global signal generated by, for example, a DAC. A clock counter (e.g., a global clock counter) may count the number of clock cycles continuously in each image frame. When the reference ramp signal reaches the level of the electrical signal at the analog storage device, the output state of the comparator in the digital pixel may change (e.g., flip, toggle, or ramp up/down). The counter value at the time when the output of the comparator in the digital pixel changes states may then be latched into a memory for a digital pixel by the toggling of the output of the comparator.

In some embodiments, the digital pixel may include a correlated double sampling (CDS) circuit (e.g., a digital CDS circuit) to reduce random noises (e.g., 1/f noise, thermal kT/C noise on a capacitor) and fixed pattern noises (FPNs) (e.g., caused by comparator threshold mismatch among the pixels). The CDS circuit may digitize a reset level at the analog storage device (e.g., to m bits) and the level of the electrical signal at the analog storage device transferred from the photodiode (e.g., to n bits). The two digitalized values may be stored in an (n+m)-bit pixel memory. A difference between the two digitized values may be used as the digital output of the digital pixel for an image frame.

In one implementation, for each image frame, the photodiode may first be exposed to the light signal and start to integrate the converted electrical signal. At or near (e.g., about 100 μs before) the end of the exposure (or integration) period, the analog storage device may be reset. The reset level may be digitized using the digitizer. After the exposure period, the (integrated) electrical signal may be transferred from the photodiode to the analog storage device, and may be digitized by the digitizer. Thus, during most (e.g., about 95%, 99%, or more) of the time of a frame period (e.g., 33 ms), the digital pixel may work at a low power mode (e.g., integration mode).

In some embodiments, the comparator of the digitizer may include a circuit that can minimize static (DC) power consumption. For example, rather than using a DC bias circuit to set the comparator at a working condition, a pre-charge circuit may be used to pre-charge an internal node of the comparator to, for example, a low level before the digitization. The pre-charging may last for a short period of time, such as a few microseconds. During the rest of the time of a frame period, the comparator may consume little or no static power. Thus, the total power consumption by the comparator can be significantly reduced.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof.

An image sensor may include an array of photo sensors. Each photo sensor may be a photodiode that can sense incident light by converting photons into charges (e.g., electrons or holes) using photoelectric effect of some optoelectronic materials. The photo sensor may also include an analog storage device, such as a capacitive device (e.g., a parasitic capacitor), to collect (e.g., accumulate or integrate) the charges generated by the photodiode during an exposure period. The collected charges can cause a voltage change at the capacitive device. The voltage change, which reflects a number of charges stored at the capacitive device within an exposure time period, may correlate to the intensity of the incident light. The voltage level at the capacitive device can be buffered and fed to an analog-to-digital converter (ADC) or other digitizers, which may convert the voltage level into a digital value representing the intensity of the incident light. An image frame can be generated based on the intensity data provided by an array of photo sensors, with each photo sensor forming a pixel of the image sensor that corresponds to a pixel of the image frame. The array of pixels of the image sensor can be arranged into rows and columns, with each pixel generating a voltage representing the intensity for a pixel at a particular location in the image. A number of pixels included in the array can determine a resolution of the generated image frame.

Embodiments of image sensors disclosed herein may include or be implemented in conjunction with an artificial reality system. Artificial reality is a form of reality that has been adjusted in some manners before being presented to a user, which may include, for example, a virtual reality (VR), an augmented reality (AR), a mixed reality (MR), a hybrid reality, or some combinations and/or derivatives thereof. Artificial reality content may include computer generated content only or computer generated content combined with captured content (e.g., images of real-world objects). The artificial reality content may include video, audio, haptic feedback, or some combinations thereof, any of which may be presented in a single channel or in multiple channels (such as stereo video that produces a three-dimensional effect to the viewer). Additionally, in some embodiments, artificial reality may also be associated with applications, products, accessories, services, or some combinations thereof, that are used to, for example, create content in an artificial reality, and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Figure 1B:
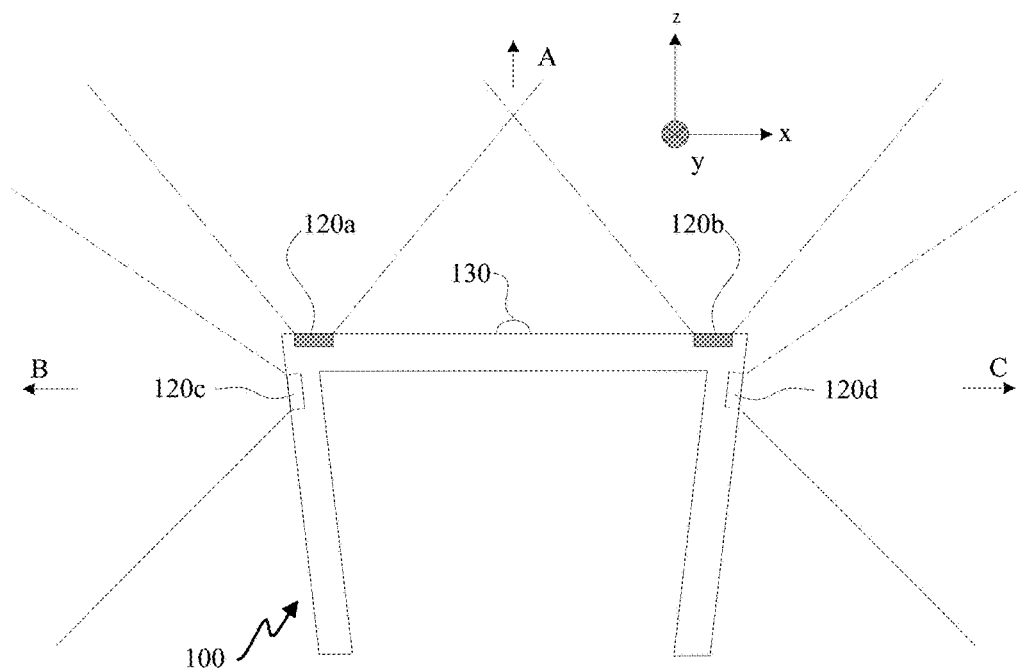
FIG. 1B is a cross-sectional view of a simplified example near-eye display including various sensors, according to certain embodiments.

FIG. 1A is a perspective view of a simplified example near-eye display 100 including various sensors, according to certain embodiments. FIG. 1B is a cross-sectional view of the simplified example near-eye display 100 including various sensors, according to certain embodiments. Near-eye display 100 may present media to a user. Examples of media presented by near-eye display 100 include one or more images, videos, and/or audio contents. In some embodiments, the audio contents may be presented via an external device (e.g., speakers and/or headphones) that receives audio information from near-eye display 100, a console, or both, and presents audio data based on the audio information. Near-eye display 100 may be configured to operate as a virtual reality (VR) display. In some embodiments, near-eye display 100 may be configured to operate as an augmented reality (AR) display and/or a mixed reality (MR) display.

Near-eye display 100 may include a frame 105 and a display 110. One or more optical elements may be coupled to or embedded in frame 105. Display 110 may be configured for the user to see content presented by near-eye display 100. Display 110 may include an electronic display and/or an optical display. For example, in some implementations, display 110 may include a waveguide display assembly for directing light from one or more generated or real images to an eye of the user.

Near-eye display 100 may include one or more image sensors 120a, 120b, 120c, and 120d. Each of image sensors 120a, 120b, 120c, and 120d may include a pixel array configured to generate image data representing different fields of view in different directions. For example, image sensors 120a and 120b may be configured to provide image data representing two fields of view in a direction A along the Z axis, whereas image sensor 120c may be configured to provide image data representing a field of view in a direction B along the X axis, and image sensor 120d may be configured to provide image data representing a field of view in a direction C along the X axis.

In some embodiments, image sensors 120a-120d may be configured as input devices to control or influence the displayed content of near-eye display 100, to provide an interactive VR/AR/MR experience to a user of near-eye display 100. For example, image sensors 120a-120d can generate physical image data of a physical environment in which the user is located. The physical image data can be provided to a location tracking system to track a location and/or a path of movement of the user in the physical environment. A system can then update the image data provided to display 110 based on, for example, the location and orientation of the user, to provide the interactive experience. In some embodiments, the location tracking system may perform a simultaneous localization and mapping (SLAM) algorithm to track a set of objects in the physical environment and within a field of view of the user as the user moves within the physical environment. The location tracking system can construct and update a map of the physical environment based on the set of objects, and track the location of the user within the map. By providing image data corresponding to multiple fields of view, image sensors 120a-120d can provide the location tracking system with a more holistic view of the physical environment, which can lead to more objects to be included in the construction and updating of the map. With such an arrangement, the accuracy and robustness of tracking the location of the user within the physical environment can be improved.

Near-eye display 100 may further include one or more illuminators 130 to project light into the physical environment. The light projected can be associated with different frequency spectrums (e.g., visible light, infra-red light, ultra-violet light, etc.), and can serve various purposes. For example, illuminator 130 may project light in a dark environment (or in an environment with a low intensity of infra-red light, ultra-violet light, etc.) to assist image sensors 120a-120d in capturing images of different objects within the dark environment to, for example, enable location tracking of the user. Illuminator 130 may project certain markers (e.g., a structured light pattern) onto the objects within the environment, to assist the location tracking system in identifying the objects for map construction/updating.

In some embodiments, illuminator 130 may also enable stereoscopic imaging. For example, one or more of image sensors 120a or 120b can include both a first pixel array for visible light sensing and a second pixel array for infra-red (IR) light sensing. The first pixel array can be overlaid with a color filter (e.g., a Bayer filter), with each pixel of the first pixel array being configured to measure intensity of light associated with a particular color (e.g., a red, green or blue color). The second pixel array (for IR light sensing) can also be overlaid with a filter that allows only IR light to pass through, with each pixel of the second pixel array being configured to measure intensity of IR lights. The pixel arrays can generate an RGB image and an IR image of an object, with each pixel of the IR image being mapped to each pixel of the RGB image. Illuminator 130 may project a set of IR markers on the object, the images of which can be captured by the IR pixel array. Based on a distribution of the IR markers of the object as shown in the image, the system can estimate a distance of different parts of the object from the IR pixel array, and generate a three-dimensional (3D) image of the object based on the distances. Based on the 3D image of the object, the system can determine, for example, a relative position of the object with respect to the user, and can update the image data provided to near-eye display 100 based on the relative position information to provide the interactive experience.

As discussed above, near-eye display 100 may be operated in environments associated with a very wide range of light intensities. For example, near-eye display 100 may be operated in an indoor environment or in an outdoor environment, and/or at different times of the day. Near-eye display 100 may also operate with or without illuminator 130 being turned on. As a result, image sensors 120a-120d may need to have a wide dynamic range, a high sensitivity, and a low noise level to be able to operate properly (e.g., to generate an output that correlates with the intensity of incident light) across a very wide range of light intensities associated with different operating environments for near-eye display 100.

Moreover, image sensors 120a-120d may need to be able to generate an output at a high speed to track the movements of the eyeballs. For example, a user's eyeball can perform a very rapid movement (e.g., a saccade movement) in which there can be a quick jump from one eyeball position to another. To track the rapid movement of the user's eyeball, image sensors 120a-120d may need to generate images of the eyeball at high speed. For example, the rate at which the image sensors generate an image frame (the frame rate) needs to at least match the speed of movement of the eyeball. The high frame rate requires short total exposure time for all of the image sensor pixels involved in generating the image frame, as well as a high speed for converting the sensor outputs into digital values for image generation. In addition, the image sensors may also need to be able to operate with a low power consumption.

Figure 2A:
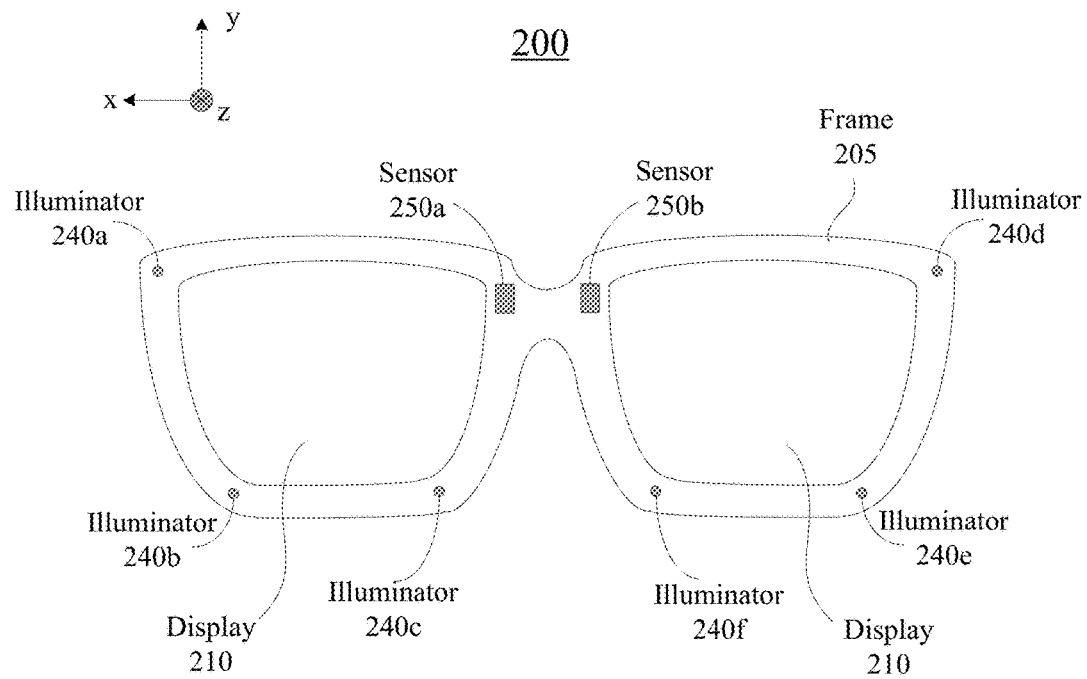
FIG. 2A is a front view of a simplified example near-eye display including various sensors, according to certain embodiments.
Figure 2B:
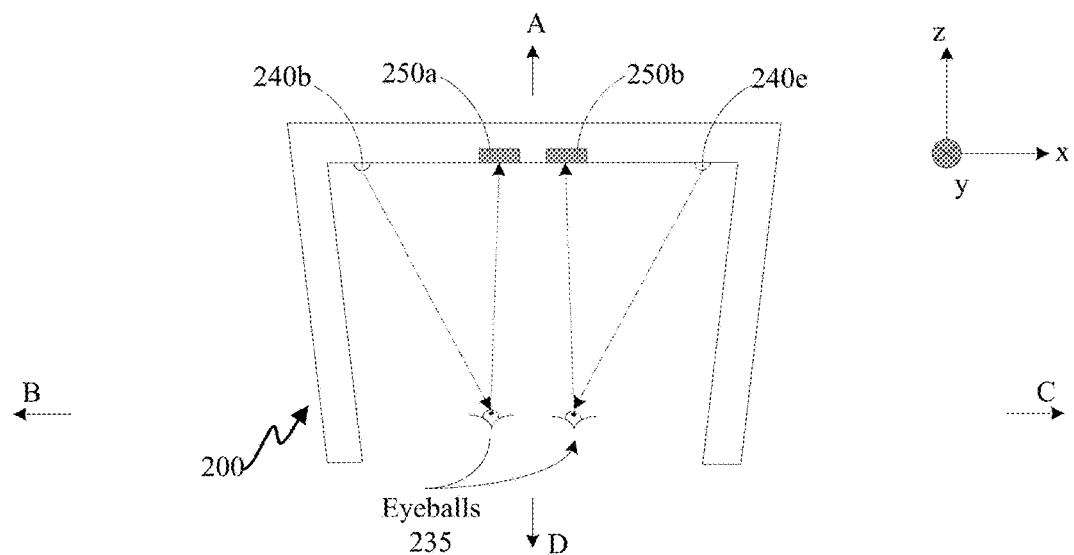
FIG. 2B is a cross-sectional view of a simplified example near-eye display including various sensors, according to certain embodiments.

FIG. 2A is a front view of a simplified example near-eye display 200 including various sensors, according to certain embodiments. FIG. 2B is a cross-sectional view of the simplified example near-eye display 200 including various sensors, according to certain embodiments. Near-eye display 200 may be similar to near-eye display 100, and may include a frame 205 and a display 210. One or more image sensor 250a and 250b may be coupled to or embedded in frame 205. FIG. 2A illustrates a side of near-eye display 200 that faces the eyeball(s) 235 of the user of near-eye display 200. As shown in FIGS. 2A and 2B, near-eye display 200 may include a plurality of illuminators 240a, 240b, 240c, 240d, 240e, and 240f. Near-eye display 200 may further include a plurality of image sensors 250a and 250b. Illuminators 240a, 240b, and 240c may emit light in a certain frequency range (e.g., NIR) in a direction D (which is opposite to direction A of FIGS. 1A and 1B). The emitted light may be associated with a certain pattern, and can be reflected by the left eyeball of the user. Image sensor 250a may include a pixel array to receive the reflected light and generate an image of the reflected pattern. Similarly, illuminators 240d, 240e, and 240f may emit NIR lights carrying a certain pattern. The NIR lights can be reflected by the right eyeball of the user, and may be received by image sensor 250b. Image sensor 250b may also include a pixel array to generate an image of the reflected pattern. Based on the images of the reflected pattern from image sensors 250a and 250b, the system can determine a gaze point of the user, and update the image data provided to near-eye display 200 based on the determined gaze point to provide an interactive experience to the user.

To avoid damaging the eyeballs of the user, illuminators 240a, 240b, 240c, 240d, 240e, and 240f are typically configured to emit light at very low intensities. In a case where image sensors 250a and 250b comprise the same sensor devices as image sensors 120a-120d, image sensors 250a and 250b may need to be able to generate an output that correlates with the intensity of incident light when the intensity of the incident light is very low, which may further increase the dynamic range requirement of the image sensors.

Figure 3:
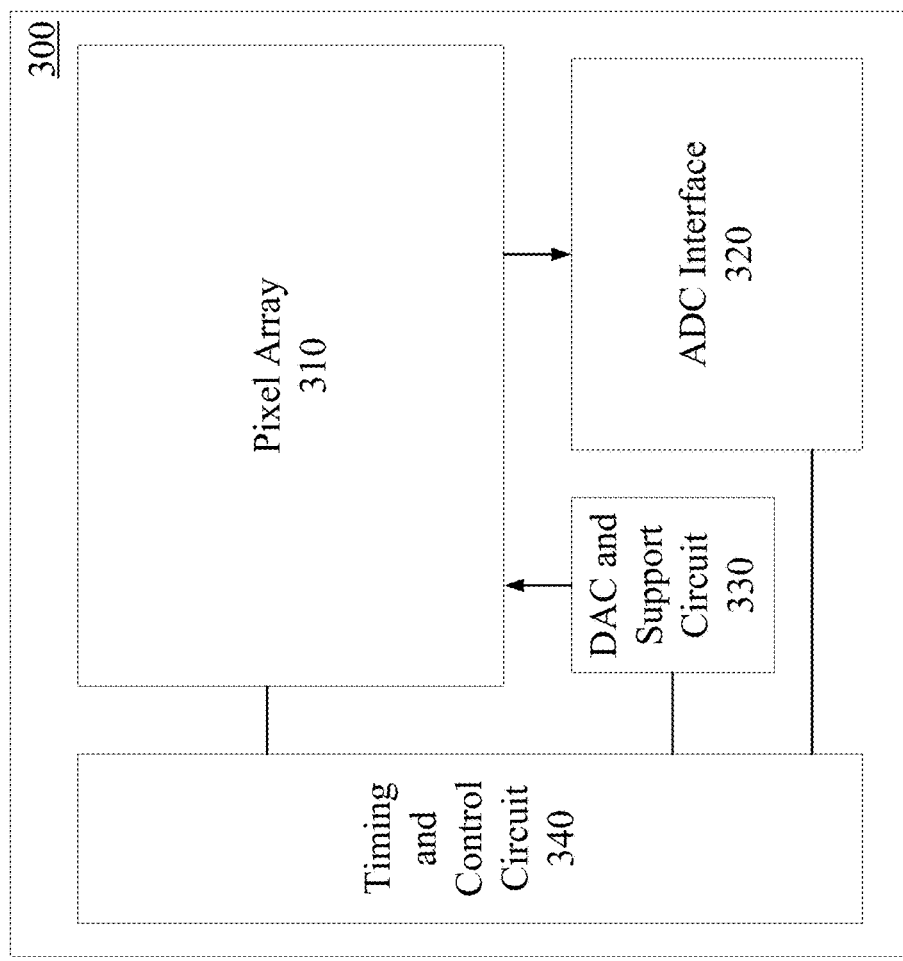
FIG. 3 is a simplified block diagram of an example image sensor with analog pixels.

FIG. 3 is a simplified block diagram of an example image sensor 300 with analog pixels. In some implementations, image sensor 300 may be an active pixel sensor (APS) image sensor. Image sensor 300 may include a pixel array 310, an ADC interface 320, a digital-to-analog converter (DAC) and support circuit 330, and a timing and control circuit 340. Pixel array 310 may include a plurality of AOS pixels. Each pixel in pixel array 310 may include a photo sensor, such as a photodetector or photodiode, that can generate an electrical voltage or current signal corresponding to the intensity of the optical signal illuminating the pixel. For example, each pixel may convert the optical signal on the pixel to an electrical current. Each pixel in pixel array 310 may also include an analog storage device, such as a capacitive device that may integrate the current to generate and store a voltage signal, which may be referred to as an analog detection signal representing gray-level/color information for the pixel.

Timing and control circuit 340 may include a row decoder and driver circuit and/or a column decoder and driver circuit at the boundary of pixel array 310 for selectively activating one or more pixels (e.g., a row of pixels) to send the analog detection signal to ADC interface 320.

ADC interface 320 may include a plurality of ADC devices. In some implementations, the ADC devices may each correspond to a column of pixels, and may be used to convert the analog detection signals from the pixels to digital image data one row at a time. Each ADC device may include two inputs, one for a reference signal and the other for the analog detection signal. The reference signal may be generated by, for example, digital-to-analog converter (DAC) and support circuit 330. The analog detection signal from each pixel may be converted into digital data by the ADC device based on the reference signal. Digital data from each row of pixels may be saved in a digital image data file to form an image frame.

In some embodiments, each ADC may include internal offset correction circuit and a correlated double sampling (CDS) circuit configured to reduce noise, such as fixed pattern noise (FPN) caused by parameter variations from pixel to pixel. The CDS circuit may also be a standalone unit outside of ADC interface 320. The CDS operation may be done by, for example, sampling and holding a reference or reset signal; sampling and holding the analog detection signal; and subtracting the reference signal from the analog detection signal to generate a correlated analog detection signal. The correlated analog detection signal may then be converted by the ADC into digital image data.

In some embodiments, each pixel in pixel array 310 may include, for example, a 4-transistor (4T) APS pixel or a 3-transistor (3T)APS pixel. For example, each 3T pixel in a pixel array may include a photodetector (e.g., a pinned photodiode), a reset gate, a selection gate, a source-follower amplifier transistor, and a capacitive device (e.g., a parasitic capacitor at the gate of the source-follower amplifier transistor). The reset gate may be turned on to clear the charge stored on the capacitive device. During exposure, charges generated by the photodetector may be stored on the capacitive device to generate an analog detection signal (e.g., a voltage signal). When the pixel is selected by activating the corresponding selection gate using, for example, a row selection signal, the analog detection signal at the capacitive device may be amplified by the source-follower amplifier transistor and sent to a readout bus (e.g., a column line) to be converted to digital image data by an ADC for the corresponding column. In some implementations, multiple pixels may share some gates to reduce the total number of gates used for the image sensor.

Figure 4:
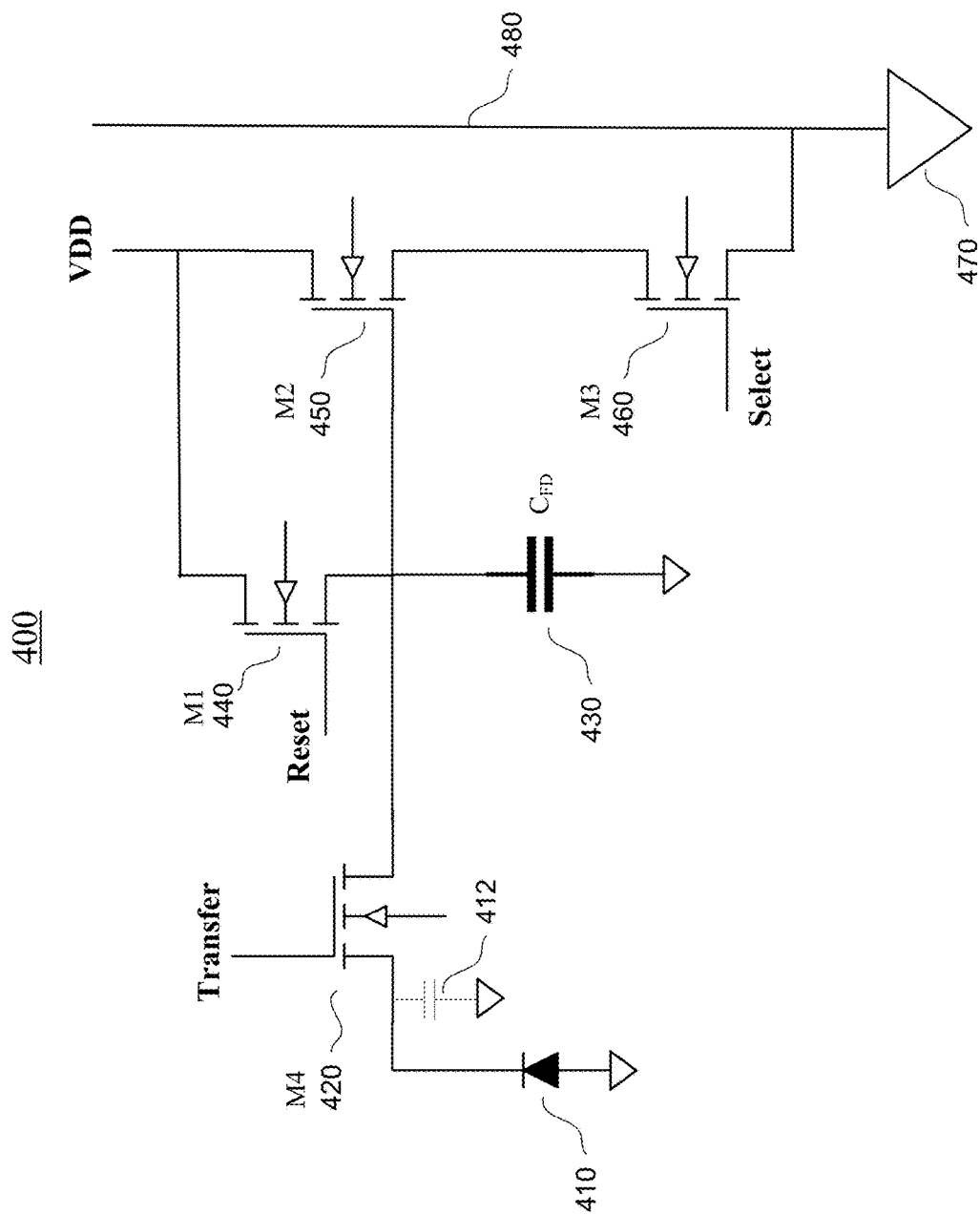
FIG. 4 illustrates an example three-transistor active pixel of an active pixel sensor (APS)

FIG. 4 illustrates an example four-transistor (4T) active pixel 400 in a CMOS active pixel sensor (APS). 4T active pixel 400 may include a photodetector (e.g., a pinned photodiode (PD) 410), a transfer gate M4 420, a capacitive storage device (e.g., a floating diffusion (FD) capacitor $C_{FD}$ 430), a reset gate M1 440, a source-follower readout transistor M2 450, and a selection gate M3 460. Pinned photodiode 410 may convert optical signals to electrical signals and store the electrical signals as charges at a capacitive device, such as a parasitic capacitor 412 at pinned photodiode 410. The stored charges can be transferred to FD capacitor $C_{FD}$ 430 through transfer gate M4 420. Reset gate M1 440 may be used to reset FD capacitor $C_{FD}$ 430 to a known voltage level. The gate of selection gate M3 460 may be connected to a selection signal, such as a row selection signal, to selectively couple FD capacitor $C_{FD}$ 430 to a readout bus (e.g., a column line 480) through source-follower readout transistor M2 450, which may amplifier the voltage signal at FD capacitor $C_{FD}$ 430.

During the operation of active pixel 400, before the exposure of each line of pixels, charges stored at parasitic capacitor 412 may be cleared or discharged using, for example, a shutter signal, and reset gate M1 440 may be turned on to clear the charge stored on FD capacitor $C_{FD}$ 430. Optionally, the voltage level on FD capacitor $C_{FD}$ 430 after reset (i.e., the reset level) may be read out. During exposure, charges generated by the photodetector may be stored on parasitic capacitor 412 at photodiode 410. At the end of the exposure, the charges may be transferred to FD capacitor $C_{FD}$ 430 through transfer gate M4 420. Pinned photodiode 410 may have a low dark current and a good blue response, and, when coupled with a transfer gate, may allow complete charge transfer from pinned photodiode 410 to FD capacitor $C_{FD}$ 430. The charges may cause a voltage change at FD capacitor $C_{FD}$ 430. When the pixel is selected by activating corresponding selection gate M3 460, the voltage signal (i.e., the analog detection signal) at FD capacitor $C_{FD}$ 430 may be amplified by source-follower readout transistor M2 450, and sent to column line 480. An ADC connected to column line 480 may then convert the amplified voltage signal to digital image data. In some implementations, the use of intrapixel charge transfer from the photodetector to the floating diffusion capacitor may reduce the noise by enabling correlated double sampling (CDS).

In many image sensors, the pixels in the image sensor may take turn in accessing the ADCs to generate digital image data, for example, one row of pixels at a time, because a limited number of ADCs in the image sensor due to, for example, chip size and/or power constrains. In general, a set of ADCs (e.g., one for each column of pixels) may be provided to simultaneously convert the voltage signals generated by the pixels in one row into digital image data. But adjacent rows of pixel cells may have to take a turn in accessing the set of ADCs. In one example, a rolling electronic shutter may be used on a CMOS image sensor, where the rows of pixels are exposed to incident lights sequentially to generate charges, and one row of pixels in the image sensor can be selected and read at a time such that the pixels of the image sensor can be selected and read row by row to generate an image frame. In one implementation, each row of pixels of the image sensor can be exposed to the incident lights for an exposure period. Pixels in the row may each generate a voltage signal based on the charges generated by the photodiode during the exposure period, and send the voltage signal to an ADC for a column. The ADCs for all columns can generate a set of digital image data representing the intensities of the incident lights received by that row of pixels. The next row of pixels can be exposed to the incident lights in a subsequent exposure period to generate another set of digital image data, until all rows of pixels have been exposed to the incident light and have output digital image data for an image frame. In another example, the exposure time of adjacent rows of pixels can have some overlap, but each row of pixels still may need to take turns in converting the voltage signals generated by photoelectric charges into digital image data. An image frame can be generated based on the digital image data of each row of pixels in the image sensor.

Figure 5B:
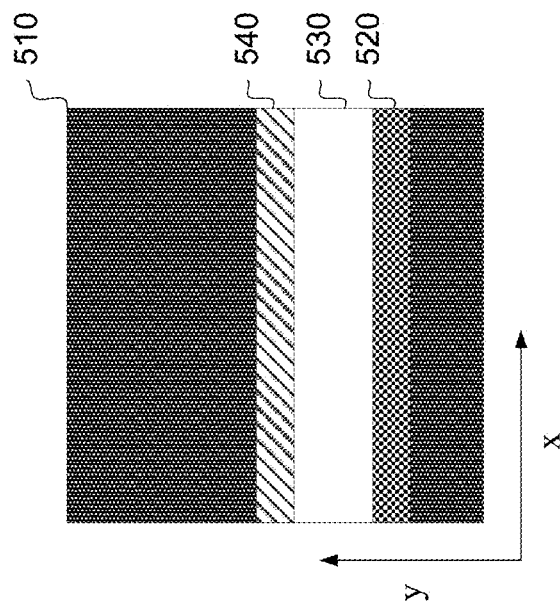
FIG. 5B illustrates example statuses of different rows of pixels in an image sensor using a rolling shutter at a second time.
Figure 5A:
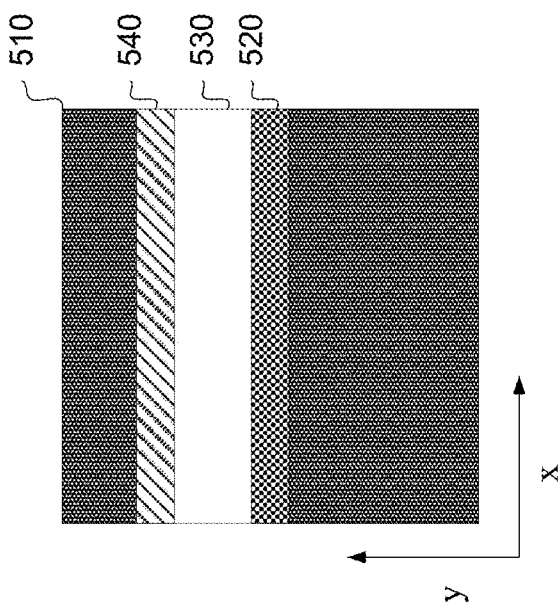
FIG. 5A illustrates example statuses of different rows of pixels in an image sensor using a rolling shutter at a first time.

FIG. 5A illustrates example statuses of different rows of pixels in an image sensor 510 using a rolling shutter at a first time instant. At the first time instant, pixels on row 520 of image sensor 510 may be reset, pixels on row(s) 530 may be exposed to light signals to accumulate charges on each pixel, and voltage signals from pixels on row 540 may be read out and converted into a digital signal by a set of ADCs. The rest of the pixels in image sensor 510 may be deactivated and may not consume any electrical power at the first time instant. The window that includes the row (e.g., row 520) of pixels being reset, the row(s) (e.g., rows 530) of pixels being exposed to VLC light signals, and the row (e.g., row 540) of pixels being read may be shifted down one row at a time to generate the image frame.

FIG. 5B illustrates example statuses of different rows of pixels in image sensor 510 using the rolling shutter at a second time instant. The second time instant is later than the first time instant. In FIG. 5B, the row of pixels being reset (e.g., row 520), the row(s) of pixels being exposed to light signals (e.g., rows 530), and the row of pixels being read (e.g., row 540) may be shifted down compared with their locations at the first time instant as shown in FIG. 5A.

As described above, an image sensor having a high speed (e.g., high frame rate), a high sensitivity, a high dynamic range, a high resolution, and a low power consumption is desired for applications such as virtual reality or augmented reality devices. However, the above described image sensor using the rolling shutter may have limited speed and limited sensitivity due to limited number of ADCs that are shared by pixels on different rows and the limited exposure time for each row of pixels.

In some embodiments, digital pixel image sensors having a digitizer for each pixel may be used to achieve a high frame rate. Each digital pixel in a digital pixel image sensor may include a photodetector (e.g., a photodiode), a transfer gate, an analog storage device (e.g., explicit or parasitic capacitor), a digitizer (e.g., an ADC), and a digital memory. The photodiode may convert light signals into electrical signals (e.g., charges or currents) and/or integrate the electrical signals. The transfer gate may be used to transfer the (integrated) electrical signals from the photodiode to the analog storage device, and the digitizer may convert the electrical signals at the analog storage device to digital bits. The digital memory may store the digital bits before the digital bits are read out from each pixel. Because each pixel in the digital pixel image sensor has its own ADC, all pixels of the digital pixel image sensor may be exposed to the light signals during a same exposure time period for an image frame, and voltage signals from all pixels of the digital pixel image sensor may be converted to digital image data in parallel. Thus, a global shutter may be used to control the exposure of all pixels in the image sensor, and the frame rate of the image sensor can be increased significantly compared with a rolling shutter image sensor described above.

Figure 6:
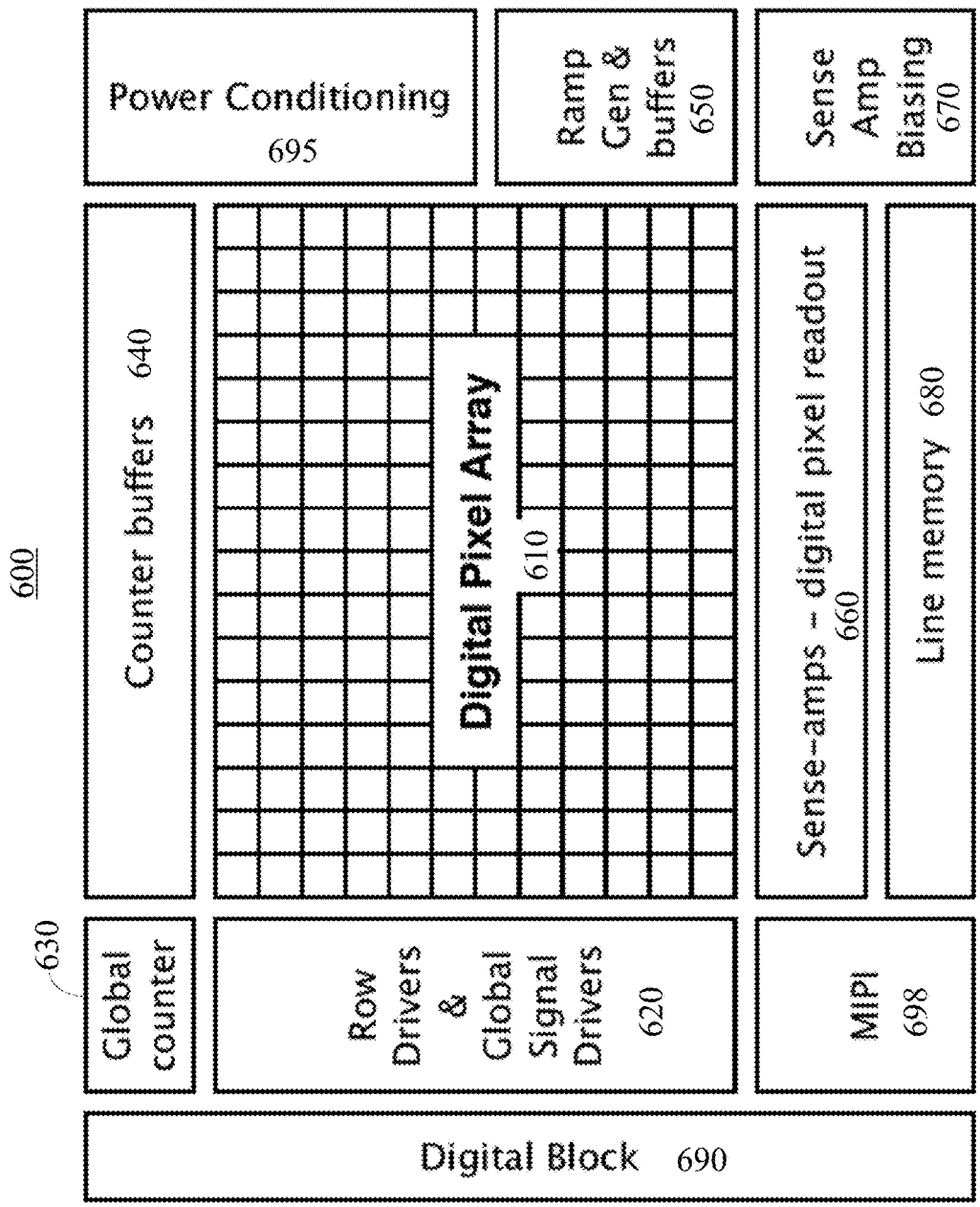
FIG. 6 is a simplified block diagram of an example global shutter digital pixel image sensor, according to certain embodiments.

FIG. 6 is a simplified block diagram of an example global shutter digital pixel image sensor 600, according to certain embodiments. Digital pixel image sensor 600 may include a digital pixel array 610 and other supporting circuits, such as row drivers and global signal drivers circuit 620, a global counter 630, counter buffer(s) 640, and a ramp generator and buffers circuit 650. Digital pixel image sensor 600 may also include sense amplifiers 660, sense amplifier biasing circuit 670, and line memory 680 for reading out digital data from each row of digital pixels to form a digital image. Digital pixel image sensor 600 may also include other circuits, such as a digital block 690, a power conditioning circuit 695, and/or a mobile industry processor interface (MIPI) circuit 698.

Digital pixel array 610 may include a two-dimensional array of pixels. Each pixel may include a photodetector (e.g., a photodiode) and a digitizer. The analog voltage signal generated by accumulating the charges generated by the photodiode in response to the incident light signal may be converted inside each pixel by the digitizer. Thus, each pixel may output digital data, rather than an analog voltage signal, that corresponds to the intensity and/or color of the incident light. In addition, analog voltage signals on all pixels of digital pixel array 610 may be converted simultaneously, allowing for a global shutter operation without using an additional shielded analog storage node in the pixel to store the analog voltage signal. Row drivers and global signal drivers circuit 620 may control the operation of the pixels, including charge integration, comparator operation, digital write, digital output, etc.

Global counter 630 may be used to provide a global counter value to all pixels of digital pixel array 610. Counter buffer(s) 640 may send the global counter value from global counter 630 to each pixel. Ramp generator and buffers circuit 650 may generate a global reference signal, such as a ramp signal (ramping up or down) or a triangle signal, for all pixels. The digitizer in each pixel may use the global counter value and the global reference signal to determine the digital data corresponding to the analog voltage signal generated by the pixel.

In some implementations, the in-pixel digital bits may not swing rail-to-rail, and thus sense amplifiers may be used to regenerate the digital values. Sense amplifiers 660 may read out the digital values in the pixels after the analog-to-digital conversion. Sense amplifiers 660 may read out the digital values in one row of pixels at a time. Each sense amplifier 660 may be connected to a pixel digital output line to read out digital data in each pixel in a row. Sense amplifier biasing circuit 670 may be used to provide bias voltages and currents to sense amplifiers 660. Line memory 680 may temporarily hold digital data read out from a row of pixels.

Digital block 690 may include a logic circuit that controls the operation of the image sensor, including the timing of the image sensor. Power conditioning circuit 695 may generate analog power and voltage sources at different levels (e.g., 3.3 V, 1.8 V, and 1.2 V) for the image sensor, and manage the powering of the image sensor, including block level power up and/or power down. MIPI circuit 698 may be used to send the digital data in MIPI output format to a memory.

By providing a digitizer (e.g., ADC) in each pixel, the pixels of a pixel array can be exposed to incident light and generate digital representations of the intensities of the incident light received at the pixels simultaneously, to provide a global shutter operation. For high speed motion capturing, global shutter is advantageous because it may avoid the motion distortion problem associated with rolling shutter operation caused by rows of pixels capturing images of different parts of a moving object at different times. Further, compared with the approach where rows of pixels take turns in being exposed to generate image data representing light intensities, the overall time for an image frame generation using the pixels can be reduced. Therefore, the disclosed techniques may increase the operation speed of the image sensor. In addition, because all pixels are exposed at the same time, the average exposure time for each pixel may be increased compared with using a rolling shutter. Thus, the sensitivity of the image sensor may be increased as well.

Figure 7:
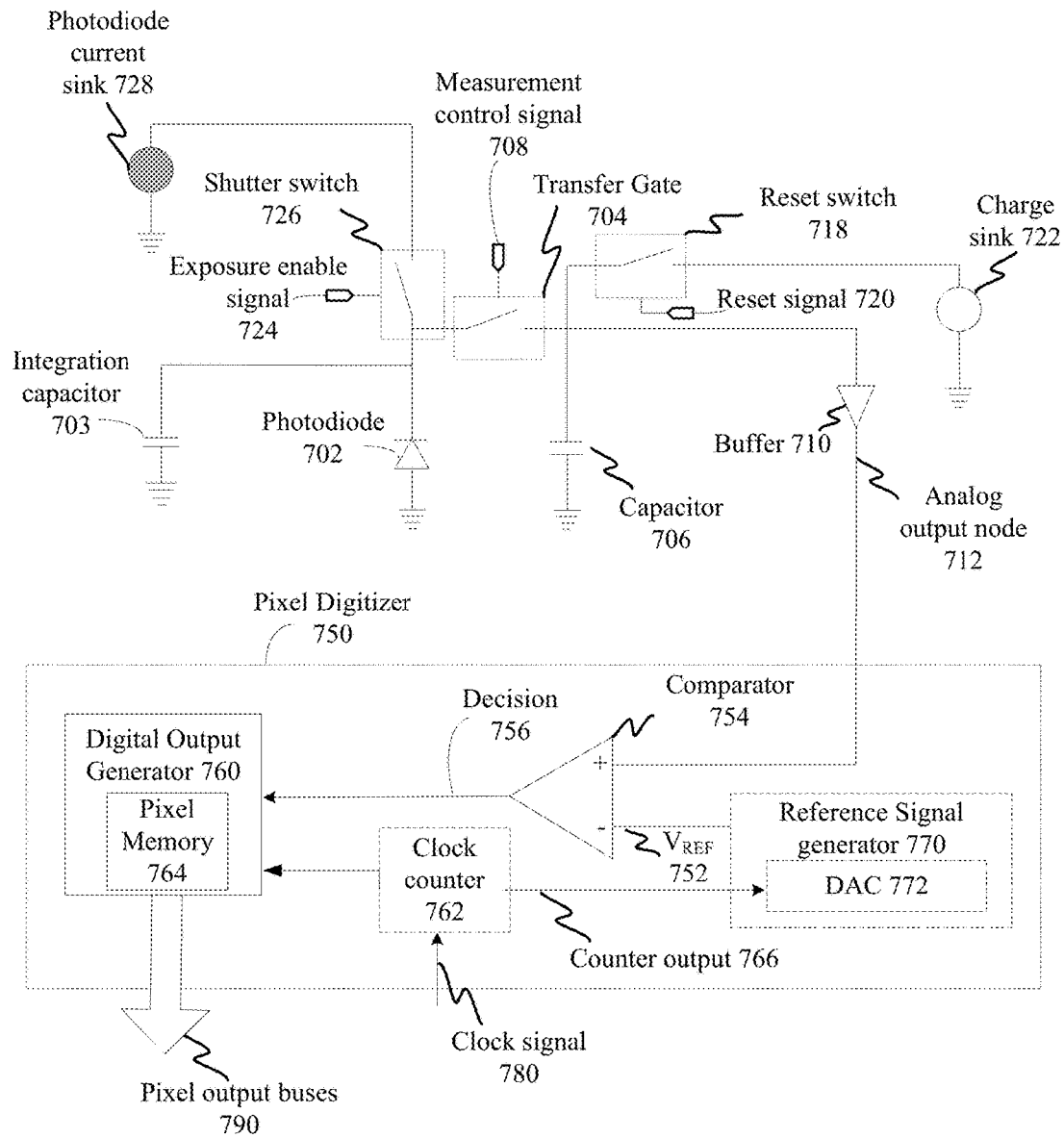
FIG. 7 is a simplified block diagram of an example digital pixel of an example global shutter digital pixel image sensor, according to certain embodiments.

FIG. 7 is a simplified block diagram of an example digital pixel 700 of an example global shutter digital pixel image sensor, according to certain embodiments. Digital pixel 700 may be part of a digital pixel array in a digital pixel image sensor, such as digital pixel array 610 in digital pixel image sensor 600. Digital pixel 700 may generate digital image data corresponding to the intensity of a pixel in an image frame. As shown in FIG. 7, digital pixel 700 may include a photodiode 702, an integration capacitor 703, a transfer gate 704, a reset switch 718, a measurement capacitor 706, an optional buffer 710, and a pixel digitizer 750. In some embodiments, digital pixel 700 may also include a shutter switch 726 controlled by a global shutter signal.

In some embodiments, photodiode 702 may include a P-N diode or a P-I-N diode. Each of shutter switch 726, transfer gate 704, and reset switch 718 may include a transistor. The transistor may include, for example, a metal-oxide-semiconductor field-effect transistor (MOSFET), a bipolar junction transistor (BJT), etc. Shutter switch 726 may act as an electronic shutter gate to control an exposure period of digital pixel 700. Before the exposure period, shutter switch 726 may be enabled (turned on) to reset integration capacitor 703. During the exposure period, shutter switch 726 may be disabled (turned off) by exposure enable signal 724, which may allow charges generated by photodiode 702 to move to integration capacitor 703 and/or measurement capacitor 706. Reset switch 718 can be disabled (turned off) by a reset signal 720, which may allow measurement capacitor 706 to store the charges generated by photodiode 702 and develop a voltage signal that correlates with a quantity of the stored charges. The voltage signal at measurement capacitor 706 may then be converted into digital data. After the conversion of the voltage signal at measurement capacitor completes, reset switch 718 can be enabled to empty the charges stored at measurement capacitor 706 to charge sink 722, to make measurement capacitor 706 available for the next measurement.

Integration capacitor 703 can be a parasitic capacitor of photodiode 702 and other circuits connected to photodiode 702, and can store charges generated by photodiode 702. Integration capacitor 703 may include, for example, a junction capacitor at the P-N diode junction interface, or other parasitic capacitor(s) connected to photodiode 702. Due to the proximity of integration capacitor 703 to photodiode 702, charges generated by photodiode 702 may be accumulated at integration capacitor 703. Measurement capacitor 706 may be a parasitic capacitor at a floating diffusion node (e.g., the floating terminal of transfer gate 704), a metal capacitor, a MOS capacitor, or any combination thereof. Measurement capacitor 706 may be used to store a quantity of charges, which can be measured by pixel digitizer 750 to provide a digital output representing the intensity of the incident light. The charges stored at measurement capacitor 706 can be charges transferred from integration capacitor 703 through transfer gate 704. Transfer gate 704 may be controlled by a measurement control signal 708 to control the charge transfer from integration capacitor 703 to measurement capacitor 706. The total quantity of charges accumulated at integration capacitor 703 and/or measurement capacitor 706 may reflect the total charges generated by photodiode 702 during an exposure period, which in turn reflects the intensity of the light incident upon photodiode 702 during the exposure period.

The charges stored at measurement capacitor 706 can be sensed by an optional sensor amplifier or an optional buffer 710 to generate a replica of the analog voltage signal (but with a larger driving strength) at analog output node 712. The analog voltage signal at analog output node 712 can be converted into a set of digital data (e.g., comprising logical ones and zeros) by pixel digitizer 750. The analog voltage signal developed at measurement capacitor 706 can be sampled and digital output can be generated after the exposure period.

Pixel digitizer 750 may include a comparator 754 and a digital output generator 760, which may include a pixel memory 764. Pixel digitizer 750 may use a counter value generated by a clock counter 762, which may be a global clock counter for all pixels in the digital pixel image sensor. Clock counter 762 can generate a set of counter values based on a clock signal 780. In some implementations, clock counter 762 may also be used to generate a global reference signal by a reference signal generator 770, which may include a digital-to-analog converter (DAC) 772 that can generate an arbitrary reference signal or a ramp or triangle waveform generator using the counter value. For example, after the digitization starts, DAC 772 may be programmed to generate a ramping reference signal $V_{REF}$ 752 corresponding to counter output 766 from clock counter 762, which can either ramp up or ramp down depending on the implementation. Comparator 754 may compare the analog voltage signal from buffer 710 and reference signal $V_{REF}$ 752 from reference signal generator 770. The output of comparator 754 may change states when the analog voltage signal from buffer 710 and reference signal $V_{REF}$ 752 cross each other. The output of the comparator may be used by digital output generator 760 to latch the current value of counter output 766 from clock counter 762 into pixel memory 764. Current counter output 766 may correspond to a total number of quantization steps used to digitize the analog voltage signal with a quantization error less than the voltage level representing a quantization step (also referred to as the least significant bit (LSB)). The counter output 766 is thus a digital representation of the quantity of charges stored at measurement capacitor 706, and a digital representation of the intensity of the incident light. The digital data in pixel memory 764 may be read out through a set of pixel output buses 790 to, for example, line memory 680 or an external memory for storing digital image frames.

Digital pixel 700 may also include or may be connected to other control circuitries (not shown in FIG. 7) to control the timing and magnitudes of exposure enable signal 724, measurement control signal 708, and reset signal 720 to control the charge accumulation operations in integration capacitor 703 and measurement capacitor 706 for the light intensity determination. It is understood that those control circuitries may be external to digital pixel 700 and may be part of, for example, row drivers and global signal drivers circuit 620 and/or digital block 690 of FIG. 6.

Figure 8:
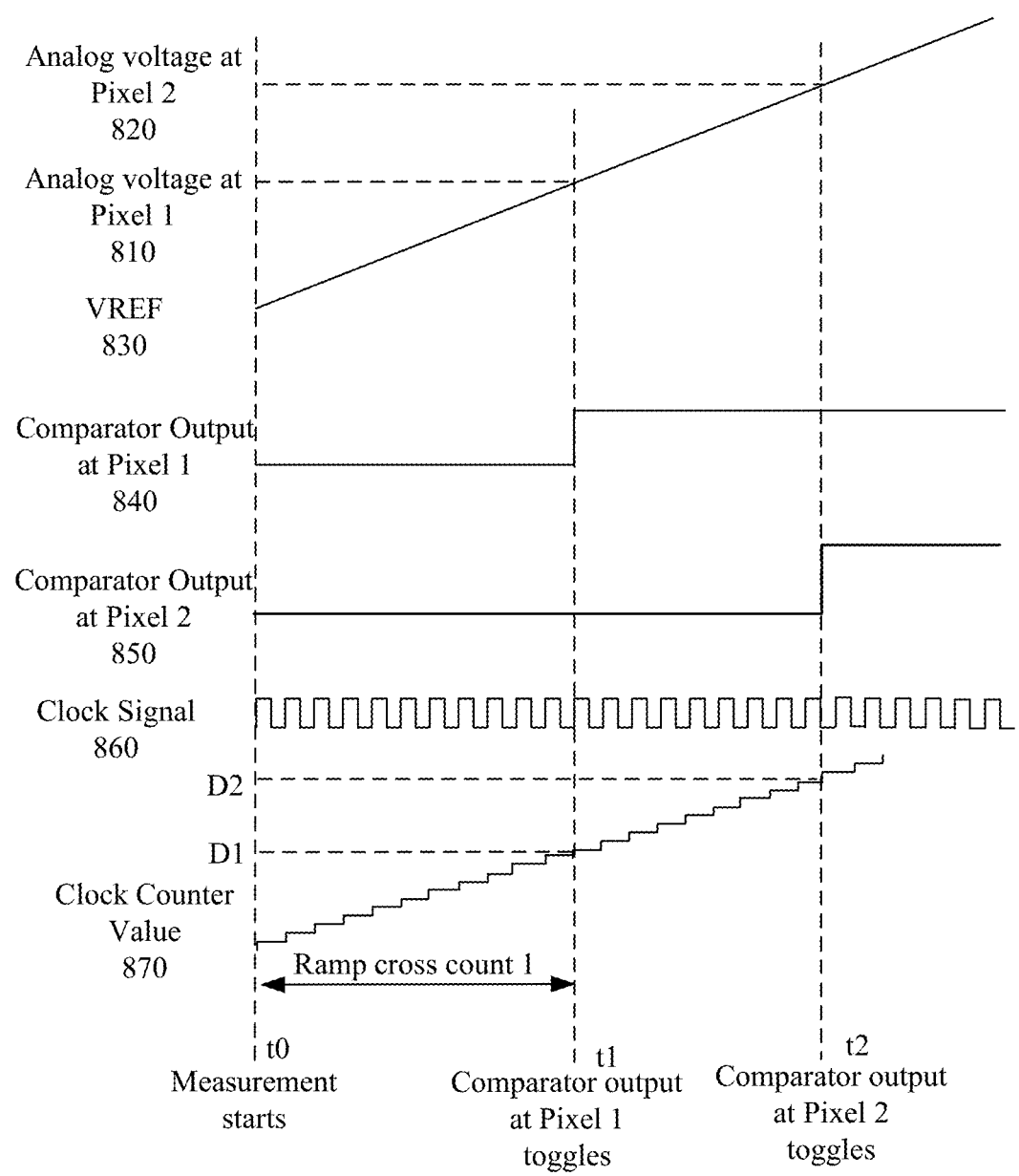
FIG. 8 illustrates example operations of example digital pixels of an example global shutter digital pixel image sensor, according to certain embodiments.

FIG. 8 illustrates example operations of example digital pixels (e.g., digital pixel 700) of an example global shutter digital pixel image sensor, according to certain embodiments. In the example shown in FIG. 8, the quantization process may be performed with a uniform quantization steps, with a reference signal (e.g., reference signal $V_{REF}$ 752 of FIG. 7) increasing (or decreasing) by the same amount for each clock cycle of a clock signal (e.g., clock signal 780). The amount of increase (or decrease) of the reference signal may correspond to a quantization step (i.e., an LSB). As the number of clock cycles increases, the reference signal may increase and reach within one quantization step of the analog voltage signal at the input of the comparator, at which time the output of the comparator may change states, for example, flipping from a low level to a high level. The flipping of the output of the comparator may latch the current counter value into a pixel memory as the digital data representing the analog voltage signal at a pixel.

FIG. 8 shows the analog voltage signal at two pixels, analog voltage signal 810 at pixel 1 and analog voltage signal 820 at pixel 2. FIG. 8 also shows a clock signal 860 and the clock counter value 870 of a clock counter that counts the number of cycles of clock signal 860. At time t0 (when the digitization starts), the clock counter may start to count the number of cycles of clock signal 860. For example, clock counter value 870 may increase by 1 after each cycle of clock signal 860. As described above, the clock counter may be a global clock counter shared by many pixels so that the size of each pixel can be reduced. As clock counter value increases, the voltage level of a reference signal VREF 830 may increase. Reference signal VREF 830 may be generated by, for example, a DAC based on clock counter value 870. Because reference signal VREF 830 is lower than analog voltage signal 810 at pixel 1 and analog voltage signal 820 at pixel 2, the output 840 of the comparator in pixel 1 and the output 850 of the comparator in pixel 2 may be at a low (or high) level.

At time t1, reference signal VREF 830 may reach (e.g., within one LSB of) analog voltage signal at pixel 1 810, and output 840 of the comparator in pixel 1 may flip from the low level to a high level. The flipping of output 840 of the comparator in pixel 1 may cause digital value D1 of clock counter value 870 at time t1 to be saved into the pixel memory of pixel 1. The clock counter may continue to count the number of cycles of clock signal 860, and the voltage level of reference signal VREF 830 may continue to increase. At time t2, reference signal VREF 830 may reach (e.g., within one LSB of) analog voltage signal at pixel 2 820, and thus output 850 of the comparator in pixel 2 may flip from the low level to a high level. The flipping of output 850 of the comparator in pixel 2 may cause digital value D2 of clock counter value 870 at time t2 to be saved into the pixel memory of pixel 2.

In this way, analog voltage signals at different pixels may be simultaneously converted to digital values that represent the light intensities at the different pixels by a comparator in each pixel using a global clock counter value and a global ramp signal VREF 830, rather than by a complex ADC in each pixel or each column of pixels. Thus, the size of the digital pixel and the power consumption of the digital pixel can be reduced significantly, which may allow for an image sensor with a higher resolution, higher density, smaller size, and low power consumption.

Various noises or errors may affect the lower limit of the measurable light intensity (often referred to as minimum resolvable signal level) of the image sensor. For example, the charges collected at the floating node may include noise charges not related to the intensity of the incident light. One source of noise charges is dark current, which can be leakage currents generated at the p-n junction of the photodiode and at the p-n junctions of other semiconductor devices (e.g., transistors) connected to a capacitor due to, for example, crystallographic defects. The dark currents can flow into the capacitor and cause voltage changes that are not correlated to the intensity of the incident light. The dark current generated at the photodiode is typically less than the dark current generated at other semiconductor devices. Some noise charges may be caused by capacitive coupling with other circuitries. For example, when the digitizer performs read operations to determine the quantity of charges stored in the floating node, the digitizer may introduce noise charges into the floating node through capacitive coupling.

Besides noise charges, the digitizer can also introduce measurement errors in determining the quantity of charges. The measurement errors can degrade the degree of correlation between the digital output and the intensity of the incident light. One source of measurement error is quantization error. In the quantization process, a discrete set of levels may be used to represent a continuous set of voltage signals, with each level representing a pre-determined range of voltage signal level. Thus, quantization error may occur when there is a difference between a voltage level represented by a quantity level and the input analog voltage approximated by the quantity level. The quantization error of the digitizer shown in FIG. 7 may be reduced by using a smaller quantization step size (e.g., the increase or decrease of reference signal VREF 830 in each step or each clock cycle) and/or a faster clock signal. Other sources of measurement errors may include, for example, random noises (e.g., thermal kT/C noise on a capacitor), device noises (e.g., of the ADC circuitries), and comparator offsets that add to uncertainties in the measurement of the quantity of charges stored in the capacitor.

The noise charges and the digitizer measurement errors can determine a lower limit of the measurable light intensity (sensitivity) of the image sensor. An upper limit of the measurable light intensity of the image sensor may be determined by the light intensity that would cause a saturation in the charges generated in a unit time (i.e., phot current) by the photodiode. A ratio between an upper limit and the lower limit may generally be referred to as a dynamic range, which may determine the range of operational light intensities for the image sensor.

In some cases, undesired offsets in the comparators and variations in other components and parameters of the digital pixels may cause fixed pattern noise (FPN). In some embodiments, the digital pixel in a digital pixel image sensor may include a correlated double sampling (CDS) circuit to reduce the offset errors and thus the FPN. The CDS circuit may measure a reset level at an analog storage device (e.g., measurement capacitor 806) and a signal level of the analog voltage signal at the analog storage device after exposure, and use the difference between the measured signal level and the reset level to determine the actual signal value for the pixel. Because the measured signal level includes the reset level component that is caused by different offsets or variations in other parameters or devices among the pixels in the image sensor, the difference between the measured signal level and the reset level may be a more accurate representation of the actual voltage change caused by the charges generated due to the light illumination of the pixel.

Figure 9:
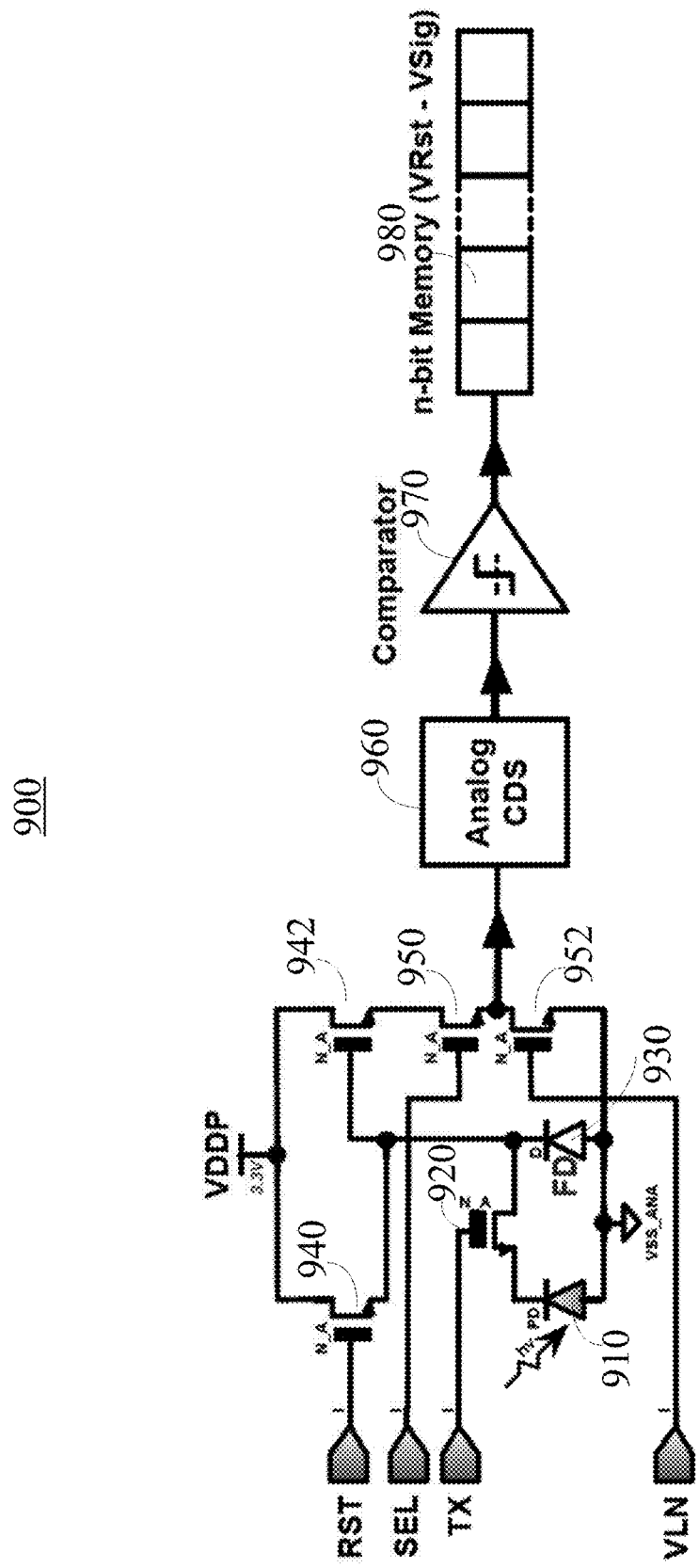
FIG. 9 is a simplified block diagram of an example digital pixel including an analog correlated double sampling (CDS) circuit, according to certain embodiments.

FIG. 9 is a simplified block diagram of an example digital pixel 900 including an analog correlated double sampling (CDS) circuit, according to certain embodiments. Digital pixel 900 may include a pinned photodiode 910, a transfer gate 920 controlled by a control signal TX, a floating diffusion node 930, a reset gate 940 controlled by a control signal RST, a selection gate 950 controlled by a control signal SEL, an in-pixel source follower buffer stage including transistors 942 and 952 and selection gate 950, to ensure high pixel conversion gain. Digital pixel 900 may also include a comparator 970 and a pixel memory 980. The operations of these circuits may be similar to the operations of active pixel 400 or digital pixel 700 described above.

As shown in FIG. 9, digital pixel 900 may further include an analog CDS circuit 960. In some implementations, analog CDS circuit 960 may include two CDS capacitors, two gates, and a differential amplifier. The analog voltage level at the measurement capacitor (i.e., FD node 930) after reset (i.e., the reset level) may be stored at one CDS capacitor through one gate, and the analog voltage level at the measurement capacitor after charge transfer (i.e., the signal level) may be stored at another CDS capacitor through another gate. The difference between the two analog voltage levels may be generated using a differential amplifier, and may then be digitized by comparator 970. Some other implementations of the analog CDS may also be used. For example, in some implementations, some circuit simplifications of analog CDS circuit 960 can be applied to reduce the total number of transistors. However, for the thermal noise (kT/C noise) of the capacitor to meet the requirement of an image sensor, the analog CDS may use a relative large area for the in pixel CDS capacitor(s). In addition, the use of the source follower buffer stage to drive the analog CDS capacitor(s) and the area of the CDS capacitor may limit the ability to shrink the digital pixel and may also increase the power consumption of the digital pixel.

Figure 10:
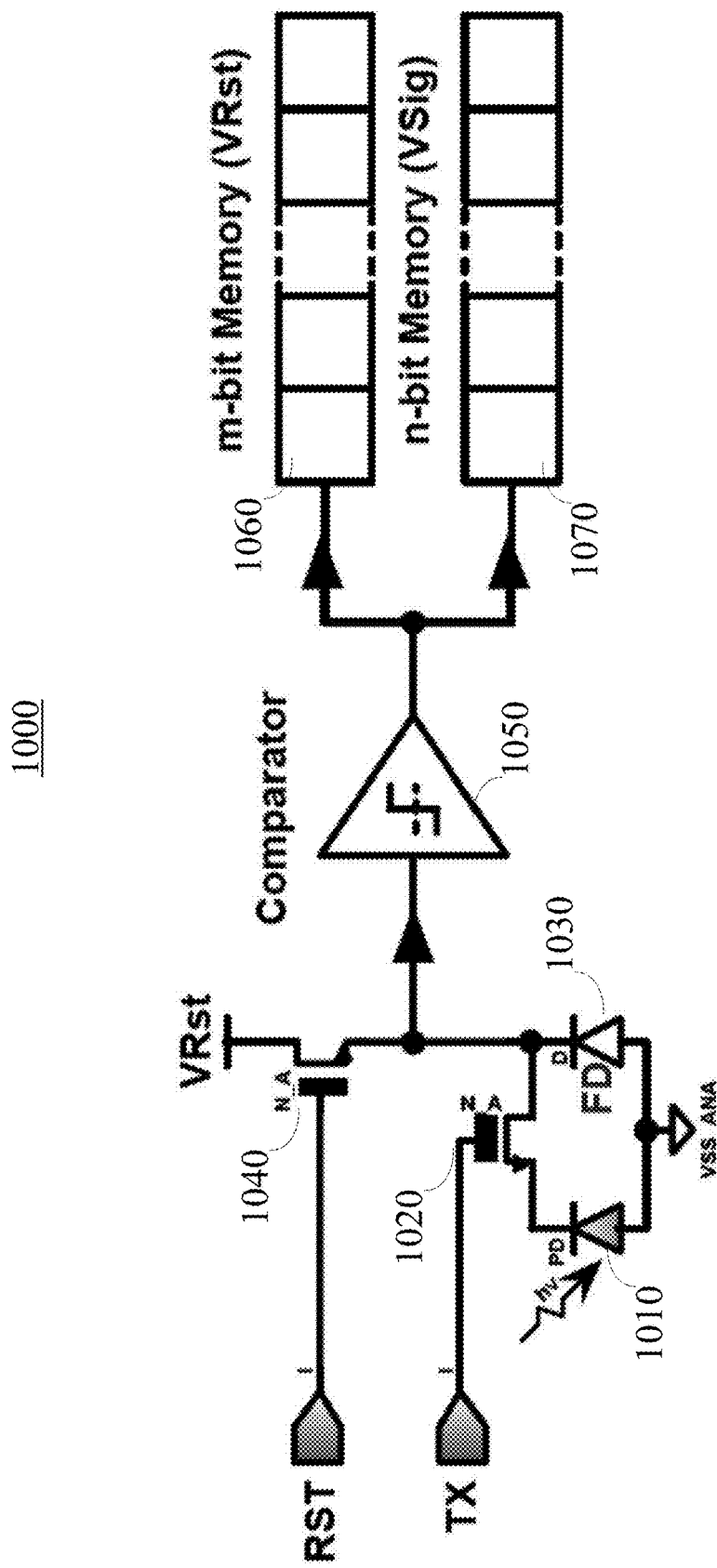
FIG. 10 is a simplified block diagram of an example digital pixel including a digital CDS circuit, according to certain embodiments.

FIG. 10 is a simplified block diagram of an example digital pixel 1000 including a digital CDS circuit, according to certain embodiments. Digital pixel 1000 may include a 3T or 4T photo sensor as described above, a comparator 1050, and a pixel memory block. The photo sensor may include a pinned photodiode 1010, a transfer gate 1020, a reset gate 1040, and a floating diffusion capacitor 1030.

Before or during the exposure of digital pixel 1000, floating diffusion capacitor 1030 may be reset to a reset level (e.g., 0 V or another DC level) by turning on reset gate 1040 using a reset signal RST. The voltage level at floating diffusion capacitor 1030 may be digitized and saved to an m-bit memory block 1060 of the pixel memory. Because the reset level is generally low, the time for the digitization using the digitizer described above may be short and the reset level may be digitized to a small value that may be represented by a small number of bits.

After the exposure of digital pixel 1000, the charges generated by pinned photodiode 1010 and accumulated at photodiode 1010 may be transferred to floating diffusion capacitor 1030 by turning on transfer gate 1020 using a transfer control signal TX. The voltage level at floating diffusion capacitor 1030 may be digitized and saved to an n-bit memory block 1070 of the pixel memory, where n may be larger than m. Because the voltage level at floating diffusion capacitor 1030 after the charge transfer may be higher than the reset level, the time for the digitization using the digitizer described above may be longer and the voltage level may be digitized to a larger value that may be represented by a larger number of bits.

The m-bit data representing the reset level and the n-bit data representing the signal level may be read out, and the difference between the n-bit data and the m-bit data may represent the detected voltage signal caused by the photo currents or charges, and thus the detected light intensity at the pixel. In this way, errors or noises caused by the mismatches or variations in devices and parameters of the pixels (e.g., offset errors, comparator threshold mismatches, capacitor mismatches, etc.) may be reduced in the digital image data. In some implementation, a subtraction of the n-bit data and the m-bit data may be performed at the pixel level before the output of the pixel is readout, such that the total number of digital bits read from a pixel may be small.

Because no additional CDS capacitor or differential amplifier may be used in the digital CDS, a digital pixel including a digital CDS circuit may use significantly less silicon area and power than a digital pixel using an analog CDS circuit.

Figure 11:
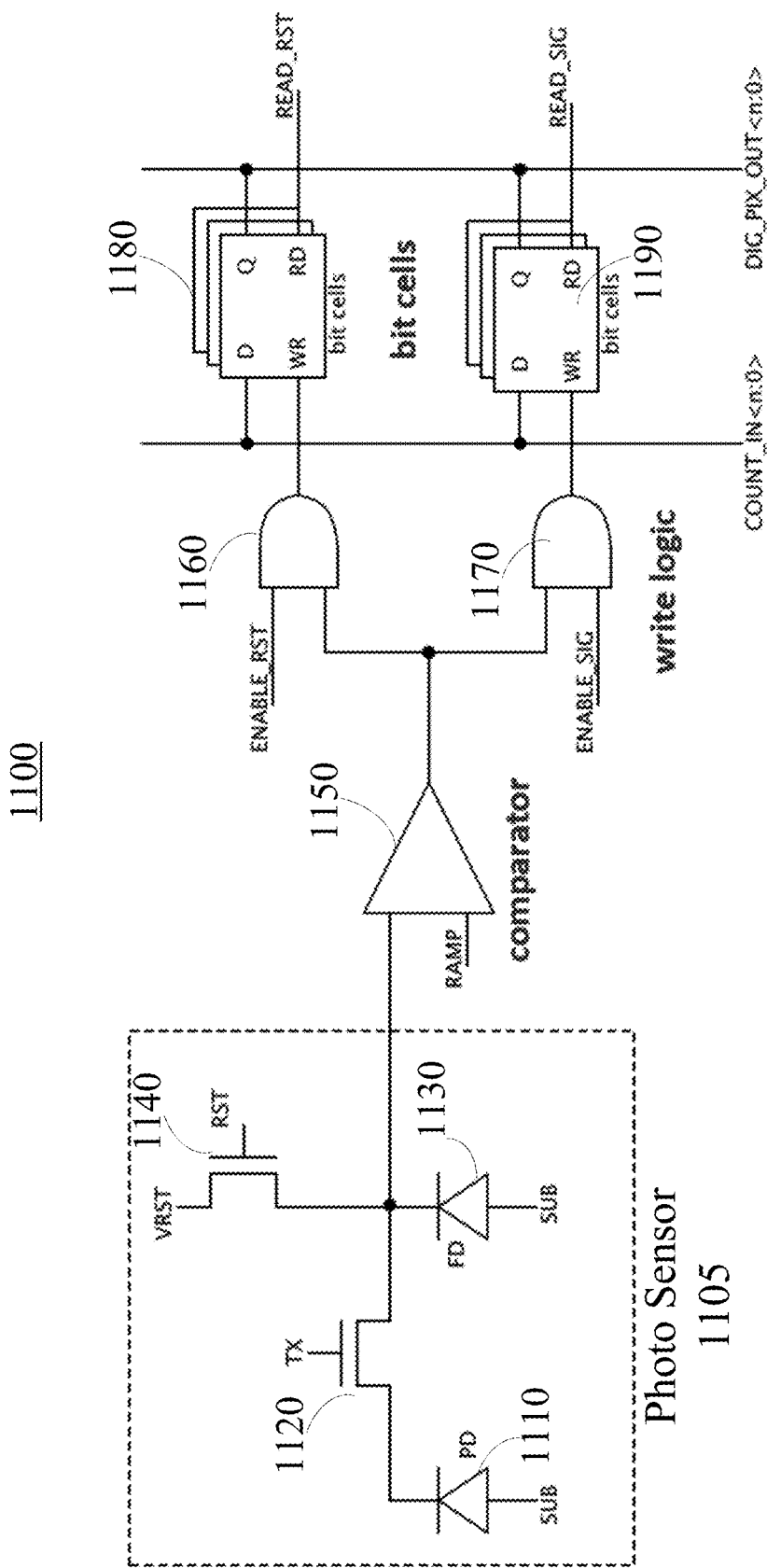
FIG. 11 illustrates an example digital pixel including a digital CDS circuit, according to certain embodiments.

FIG. 11 illustrates an example digital pixel 1100 including a digital CDS circuit, according to certain embodiments. Digital pixel 1100 may be an example implementation of digital pixel 1000. Digital pixel 1100 may include a photo sensor 1105 that may include a pinned photodiode 1110, a transfer gate 1120, a reset gate 1140, and a floating diffusion capacitor 1130. Digital pixel 1100 may also include a comparator 1150, such as a comparator 754, for analog voltage level digitization.

Digital pixel 1100 may further include a write logic that may include an AND (or NAND) gate 1160. Inputs of AND (or NAND) gate 1160 may be connected to the output of comparator 1150 and a reset enable signal enable_rst (e.g., the reset signal used to turn on reset gate 1140 or a signal synchronized with the reset signal). The output of AND (or NAND) gate 1160 may be connected to the write enable inputs of m bit cells 1180 (e.g., D flip-flops). When the reset level is digitized, the reset enable signal enable_rst may be asserted (e.g., set to a high level). When the output of comparator 1150 change states, for example, from "0" to "1" when the reference signal (e.g., a ramp signal) reaches the reset level, the output of AND (or NAND) gate 1160 may flip from "0" to "1," which may cause the current counter value from, for example, a global clock counter to be latched into the m bit cells 1180, which may be read out later.

The write logic of digital pixel 1100 may further include an AND (or NAND) gate 1170. Inputs of AND (or NAND) gate 1170 may be connected to the output of comparator 1150 and a read enable signal enable_sig (e.g., a select signal used to select the pixel). The output of AND (or NAND) gate 1170 may be connected to the write enable inputs of n bit cells 1190 (e.g., D flip-flops). When the pixel signal level is digitized, the read enable signal enable_sig may be asserted (e.g., set to a high level). When the reference signal (e.g., a ramp signal) reaches the pixel signal level, the output of comparator 1150 may flip, for example, from "0" to "1," and thus the output of AND (or NAND) gate 1170 may flip from "0" to "1," which may cause the current counter value from the global clock counter to be latched into the n bit cells 1190, which may be read out later.

In this way, errors or noises caused by the mismatches and variations in devices and parameters of the pixels (e.g., offset errors, comparator threshold mismatches, capacitor mismatches, etc.) may be reduced in the digital image data. Compared with a digital pixel that may not include a digital CDS circuit, digital pixel 1100 may use m additional bit cells, such as D flip-flops, which are digital circuits and may use a small area. As also described above, using the digital pixel, a global shutter may be possible for the image sensor for increased frame rate and sensitivity (e.g., due to a longer exposure time for each pixel). The reset levels of the digital pixels may be digitized at different times during the time period for an image frame.

FIG. 12A illustrates example timing periods during the operation of a global shutter digital pixel sensor with a digital CDS circuit for each pixel, according to certain embodiments. All pixels in the digital pixel sensor may operate in the same manner at the same time. A time period 1200 for a digital pixel to output one set of output data for an image frame may include a shutter period 1210, an integration period 1212, a reset period 1214, a reset level conversion period 1216, a charge transfer period 1218, a signal level conversion period 1220, and a data output period 1222.

The time period for a digital pixel to generate one set of output data for an image frame may start with shutter period 1210, during which the voltage level at the photodiode may be reset and the time period for pixel integration may be set. At the end of shutter period 1210, each digital pixel may start signal integration (e.g., charge accumulation) in integration period 1212, during which the parasitic capacitor of the photodiode (e.g., integration capacitor 703 that may include the parasitic capacitor of photodiode 702 and other circuits connected to photodiode 702) of the digital pixel may collect charges (e.g., photoelectrons) generated by the photodiode in response to the incident light at the digital pixel. At a short period (e.g., less than 100 µs) before the end of integration period 1212, a measurement capacitor (e.g., measurement capacitor 706 or floating diffusion capacitor 1130) of each pixel may be reset in reset period 1214, followed by the analog-to-digital conversion of the reset voltage level during reset level conversion period 1216. The digitized pixel reset level may be stored in the pixel memory, such as the m bit cells 1180. After the pixel reset level is converted, the accumulated charges in the integration capacitor at the photodiode of each pixel can be transferred to the measurement capacitor (e.g., redistributed between the integration capacitor at the photodiode and the measurement capacitor) during charge transfer period 1218, followed by the analog-to-digital conversion of the pixel signal level (i.e., the voltage level on the measurement capacitor after charge transfer) during signal level conversion period 1220. The digitized pixel signal level of each pixel may be stored in the pixel memory, such as the n bit cells 1190. After the digitized pixel reset level and signal level are stored in the pixel memory, data output period 1222 may start and the digital values of the pixel reset level and signal level for each pixel may be read out of the pixel array, row by row. The digital values can be read out much faster than the analog voltages.

Because the digital pixel can start to accumulate charges for the next image frame after the previously accumulated charges have been transferred to the measurement capacitor, the frame time period for the digital image sensor, T_Frame, may be equal to the sum of shutter period 1210 (T_Shutter), integration period 1212 (T_Int), reset period 1214 and reset level conversion period 1216 (collectively T_Rst), and charge transfer period 1218 (T_TX). As discussed above, the reset level is generally low, and thus the time for digitizing the reset level may be short. Charge transfer period 1218, signal level conversion period 1220, and data output period 1222 may also be short compared with the integration period. Thus, the frame integration overhead (non-integration time) within a frame time period may be small. In one example, the frame time period may be about 33 ms (i.e., at a frame rate of 30 frames per second), and the frame integration overhead (which may include reset period 1214, reset level conversion period 1216, charge transfer period 1218, and, in some implementations, signal level conversion period 1220, and data output period 1222) may be about 100 µs. Thus, during most (e.g., about 95%, 99%, or more) of the time of a frame time period, the digital pixel may work at a low power mode (e.g., integration mode). Because the digital pixel may consume very little power in the low power mode during shutter period 1210 and integration period 1212, which may occupy a majority of the time period of a frame time period, the overall power consumption of the digital pixel may be very low.

FIG. 12B is a timing diagram illustrating the operations of a digital pixel with a digital CDS circuit in a global shutter digital pixel sensor, according to certain embodiments. In FIG. 12B, the first reset pulse 1252 of reset signal RST 1250 and the first transfer control pulse 1262 of transfer control signal TX 1260 may occur the same time (e.g., at the end of a shutter period, such as shutter period 1210), such that the integration capacitor and the measurement capacitor can be reset or discharged. After first reset pulse 1252 and first transfer control pulse 1262, the pixel integration may start. At the end of the integration period, a second reset pulse 1254 may reset the measurement capacitor (e.g., the floating diffusion capacitor) to a reset level, such as 0 V or another DC level. The reset level of the measurement capacitor may be digitalized using a comparator, a clock counter, and a ramp signal 1270. As described above, during the digitization of the reset level, ramp signal 1270 may increase or decrease gradually as shown by a ramp 1272. A clock counter may count the number of clock cycles. The clock counter value 1280 at the time when ramp signal 1270 reaches the reset level may be saved as a reset count 1282 in the pixel memory (e.g., an m-bit reset level memory). Subsequently, a second transfer control pulse 1264 may be asserted to transfer charges from the integration capacitor at the photodiode to the measurement capacitor. The voltage level on the measurement capacitor (referred to as signal level) may be digitized using the comparator, ramp signal 1270, and the clock counter as described above. During the digitization of the signal level, ramp signal 1270 may increase or decrease gradually as shown by a ramp 1274. The clock counter value 1280 at the time when ramp signal 1270 reaches the reset level may be saved as signal count 1284 in the pixel memory (e.g., an n-bit signal level memory). Reset count 1282 and signal count 1284 may be read out from the digital pixel memory and sent out as output data 1292 in MIPI format on an MIPI interface 1290. The reset count representing the reset level may use fewer bits than the signal count representing the signal level because the reset value at the measurement capacitor is generally small.

FIGS. 12A and 12B show that the reset level is measured at the end of the integration period. In some implementations, the reset level may be measured at another time. For example, the reset level may be measured and digitized during the shutter period, at the beginning of the integration period, or in the middle of the integration period, because the measurement capacitor and the integration capacitor may be isolated by the transfer gate. The examples shown in FIGS. 12A and 12B may have a better performance in reducing the noise of the digital pixel, such as noises caused by dark current and the 1/f noise, than other operation and timing configurations of the digital pixel.

For example, as shown in FIGS. 12A and 12B, because the measurement capacitor is reset right before the charge transfer and signal level digitization, the time for the dark current to accumulate charges on the measurement capacitor before the signal level is digitized may be short, and thus the noise or error caused by the dark current can be small. In contrast, if the measurement capacitor is reset at the beginning of the integration period or during the shutter period, the time for the dark current to accumulate charges on the measurement capacitor may last for the whole or a majority of the integration period, and thus the noise or error caused by the dark current can be large.

Furthermore, because the measurement capacitor is reset right before the charge transfer and signal level digitization, the CDS circuit is effectively switched at a high frequency due to the short time period between the reset of the measurement capacitor and the charge transfer. Thus, the 1/f noise (i.e., flicker noise or pink noise) of the digital pixel may be reduced because of the higher operating frequency. On the contrary, if the measurement capacitor is reset at, for example, the beginning of the integration period, the CDS circuit is effectively switched at a lower frequency due to the longer time period between the reset of the measurement capacitor and the charge transfer. Therefore, the noise or error caused by the 1/f noise may be larger in such a data conversion process.

As described above, because each digital pixel includes a digitizer, the overall power consumption of the digital pixel image sensor may be high when all pixels operate in parallel. For example, if each digitizer consumes 1 µW, an image sensor with 1 million digital pixels may consume at least 1 W, which may not be suitable for mobile or wearable devices, such as HMDs. Thus, it is desirable to reduce the power consumption of the digitizer, buffer, and other circuits in the digital pixel. In some examples described above with respect to, for example, FIG. 7, the digitizer may use a comparator to compare the signal level with a reference level and latch clock counter values to the pixel memory. Because the latch and pixel memory may consume little power, reducing the power consumption of the comparator may be more effective in reducing the power consumption of the digitizer and the digital pixel.

Figure 13:
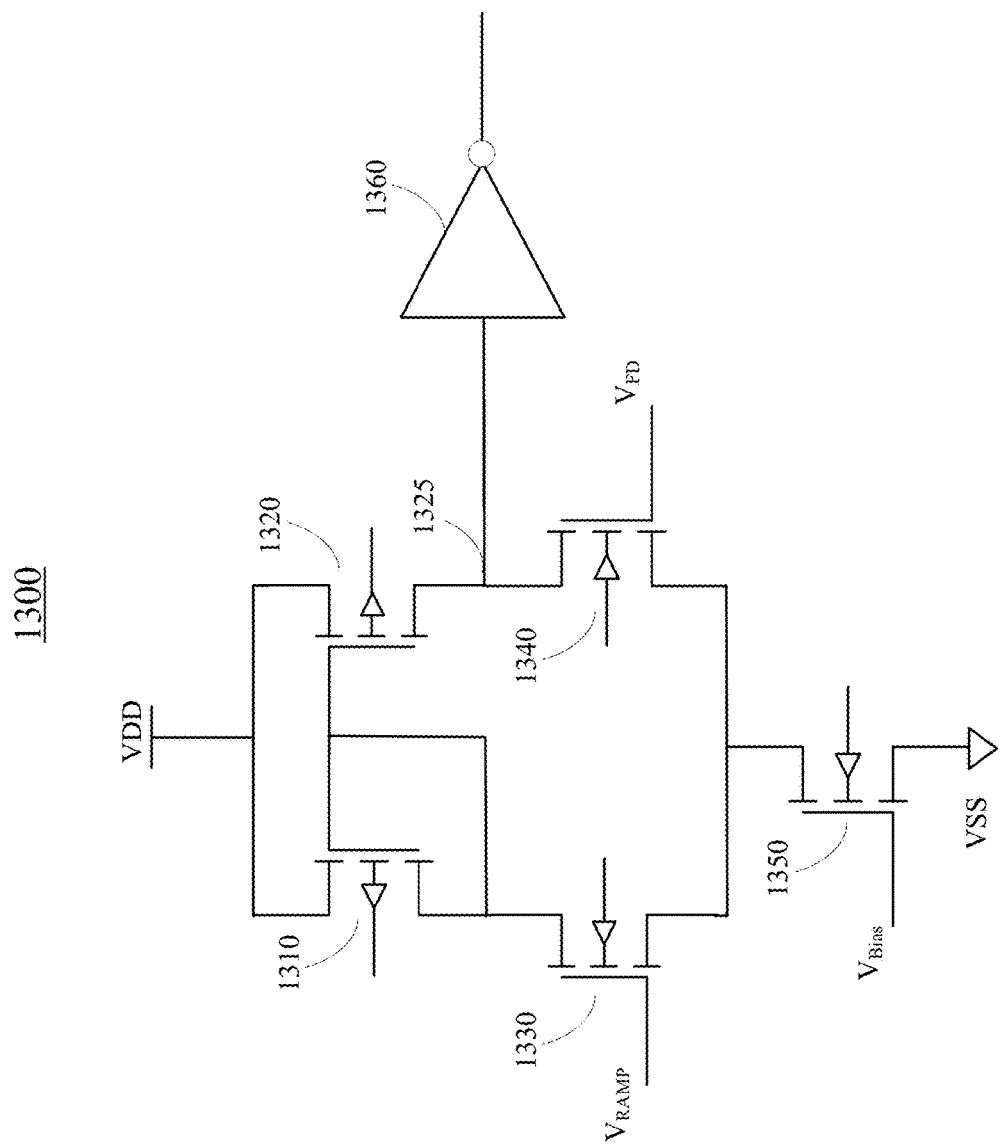
FIG. 13 illustrates an example comparator including a DC bias circuit.

FIG. 13 illustrates an example comparator 1300 including a DC bias circuit. Comparator 1300 may include a different amplifier that may include P-channel transistors 1310 and 1320, N-channel transistors 1330, 1340, and 1350. The analog voltage signal $V_{FD}$ from the measurement capacitor may be connected to the gate of one of transistor 1330 and transistor 1340, while the ramp signal $V_{RAMP}$ from a reference signal generator (e.g., reference signal generator 770) may be connected to the gate of the other one of transistor 1330 and transistor 1340. The difference between the ramp signal $V_{RAMP}$ and the analog voltage signal $V_{FD}$ from the measurement capacitor may cause different currents through transistors 1310, 1320, 1330, and 1340. Therefore, the voltage level at node 1325 may depend on the difference between the ramp signal $V_{RAMP}$ and the analog voltage signal $V_{FD}$ from the measurement capacitor. An inverter 1360 connected to node 1325 may convert the voltage level at node 1325 to a "high" or "low" signal.

In comparator 1300, the transistors of the differential amplifier may be biased by transistor 1350 to appropriate DC operation levels of the transistors. During the operation of the comparator, a reduction in the current through transistor 1330 may correspond to an increase in the current through transistor 1340, and the DC bias current through transistor 1350 may remain constant. Thus, differential amplifier of comparator 1300 may consume a DC power for biasing the transistors. As discussed above, if the DC power for the biasing is 1 µW per pixel, an image sensor with 1 million digital pixels may consume at least 1 W.

Figure 14:
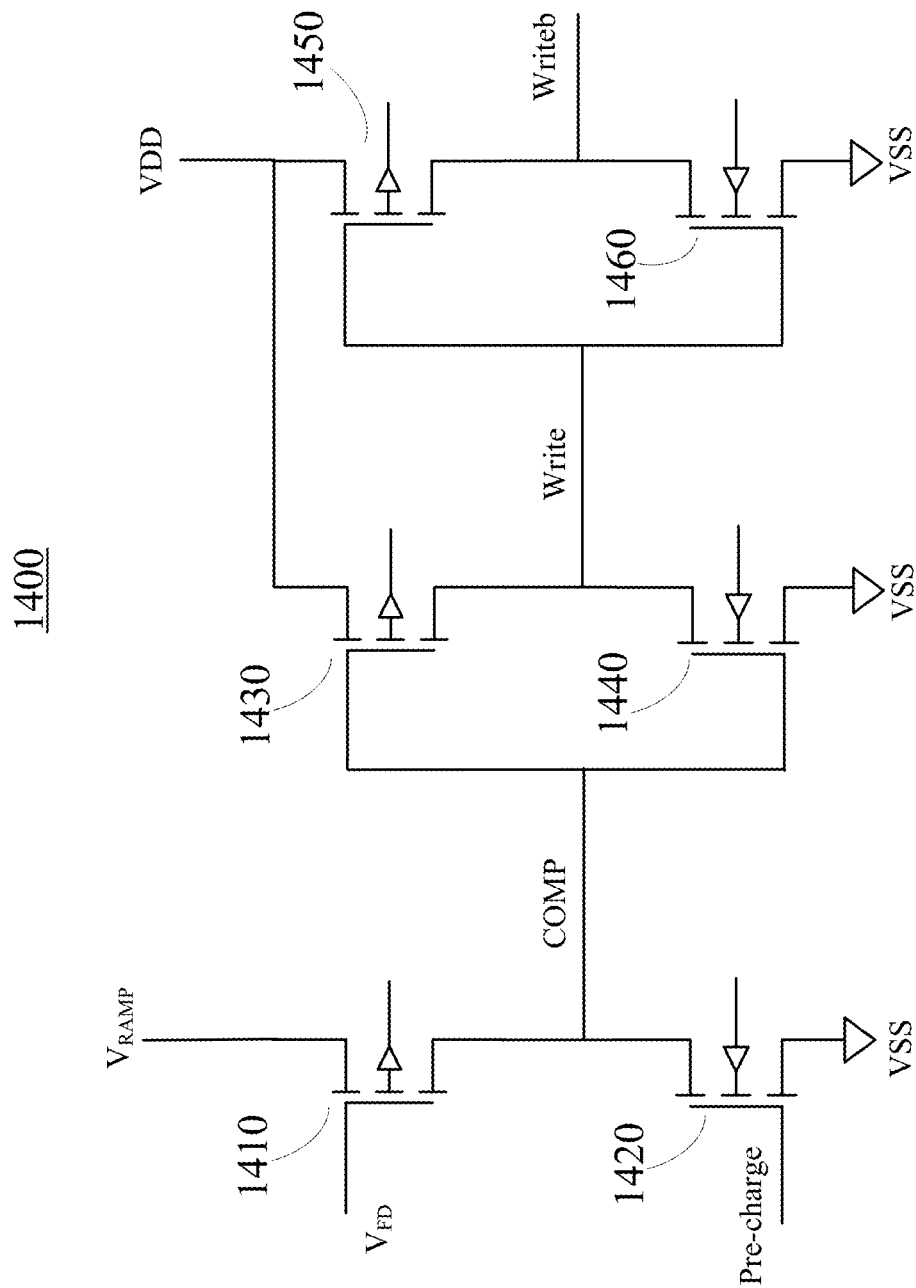
FIG. 14 illustrates an example comparator including a pre-charging circuit, according to certain embodiments.

FIG. 14 illustrates an example comparator 1400 including a pre-charging circuit, according to certain embodiments. In comparator 1400, the analog voltage signal $V_{FD}$ from the measurement capacitor may be connected to the gate of transistor 1410, while the reference signal $V_{RAMP}$ may be connected to the source (or drain) of transistor 1410. In some implementations, transistor 1410 may be a p-channel metal-oxide-semiconductor (PMOS) transistor, and no DC bias circuit is used to bias transistor 1410. Rather, a pre-charge circuit including a pre-charge transistor 1420 may be used to pre-charge the output node COMP of the comparator before the digitization of the analog voltage signal $V_{FD}$ begins. During the digitization, pre-charge transistor 1420 may be turned off and no current may flow through pre-charge transistor 1420. Thus, DC bias current and static power consumption may be reduced or minimized.

Comparator 1400 may also include one or more inverters. For example, as shown in FIG. 14, a first inverter may include transistors 1430 and 1440 to generate a write signal, and a second inverter may include transistors 1450 and 1460 to generate a writeb signal. The write signal and the writeb signal may be used to latch clock counter values into the pixel memory. In some implementations, transistors 1410 and 1420 may have a thick gate oxide and may operate at 3.3 V, while one or both of the two inverters may include transistors with a thin gate oxide and may operate at a lower voltage, such as 1.8 V or 1.2 V, such that the switching edge of the write signal and/or writeb signal may be sharp and the level of the write signal and/or writeb signal may better match the operational voltage of the digital circuits including the combination logic (e.g., AND gates 1160 and 1170) and memory devices. One motivation of using thin oxide transistors is that they may occupy a smaller area in the pixel and also have a lower power consumption than thick oxide transistors.

Figure 15:
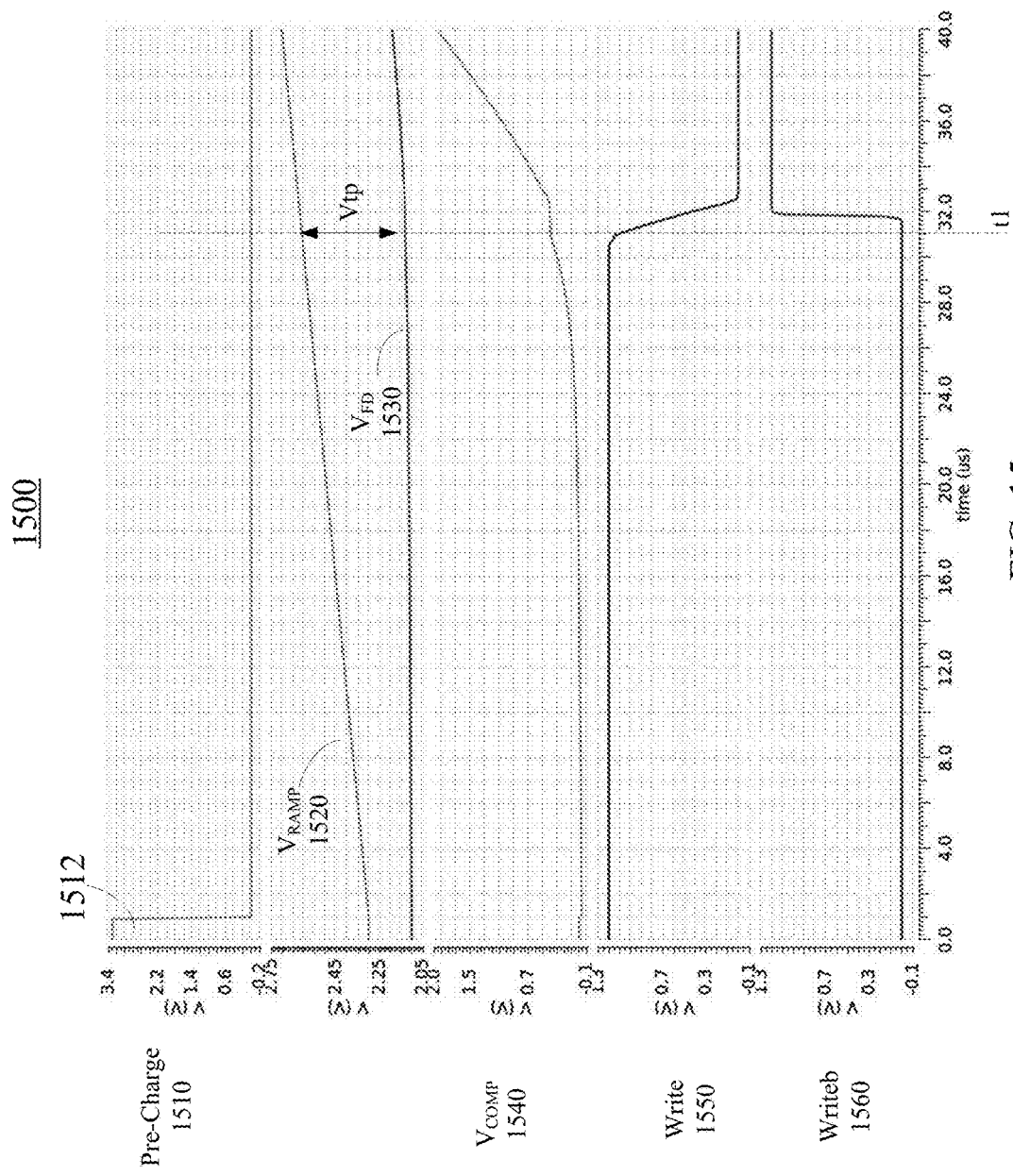
FIG. 15 is a timing diagram illustrating the operations of the example comparator of FIG. 14, according to certain embodiments.

FIG. 15 is a timing diagram 1500 illustrating the operations of an example comparator, such as comparator 1400 shown in FIG. 14, according to certain embodiments. FIG. 15 shows a pre-charge signal 1510 that may be used to control pre-charge transistor 1420, a ramp signal $V_{RAMP}$ 1520 that may be connected to the source of p-channel transistor 1410, a $V_{FD}$ signal 1530 that may drive the gate of transistor 1410, a signal $V_{COMP}$ 1540 at the drain of transistor 1410, a write signal 1550 at the output of the first inverter of comparator 1400, and a writeb signal 1560 at the output of the second inverter of comparator 1400. As shown in FIG. 15, before the starting of the digitizing operation, a high level pulse is applied to the gate of pre-charge transistor 1420 to turn on pre-charge transistor 1420, and thus node COMP may be pre-charged to a low level (e.g., Vss). After the pre-charge operation, pre-charge signal 1510 may be set to a low level to turn off pre-charge transistor 1420, and the analog-to-digital conversion may start. During the analog-to-digital conversion, ramp signal $V_{RAMP}$ 1520 may increase gradually. When ramp signal $V_{RAMP}$ 1520 is less than the sum of $V_{FD}$ signal 1530 and the threshold voltage Vtp of transistor 1410, transistor 1410 may be turned off and signal $V_{COMP}$ 1540 may be low. Thus, write signal 1550 at the output of the first inverter may be high, and writeb signal 1560 at the output of the second inverter may be low. At time t1, ramp signal $V_{RAMP}$ 1520 becomes greater than the sum of $V_{FD}$ signal 1530 and the threshold voltage Vtp of transistor 1410, transistor 1410 may be turned on to charge node COMP such that signal $V_{COMP}$ 1540 may be increased to a high level that may trigger the first inverter to flip. Thus, write signal 1550 at the output of the first inverter may become low, and writeb signal 1560 at the output of the second inverter may become high after a gate delay.

As shown in FIG. 15, the pre-charge transistor is only turned on for a short period of time (e.g., about 1 us) before the digitization of the analog voltage signal at the measurement capacitor. During the rest of the time of a frame time period, the comparator may consume little or no static power. Thus, static (DC) power consumption by the comparator may be reduced or minimized. As such, the overall power consumption of the digital pixel image sensor may be reduced or minimized.

Therefore, techniques disclosed herein may increase frame rate by using a global shutter and per-pixel digitizers and reading a digital value rather than an analog signal from each pixel. The techniques disclosed herein may also reduce the random and fixed noises (e.g., offset errors, dark currents, and 1/f noise) using a CDS circuit and thus improve the sensitivity, signal-to noise ratio (SNR), dynamic range, etc. of the image sensor. Techniques disclosed herein may also reduce the pixel size for each digital pixel by using a comparator (rather than a complex ADC) and a digital CDS, and thus may increase the density or resolution of the digital pixel image sensor. Techniques disclosed herein may also reduce the power consumption of the digital pixels by reducing the time period that the digital pixels may operate at a high power mode and by reducing static (DC) power consumption by the comparator in the digitizer of the digital pixel.

Figure 16:
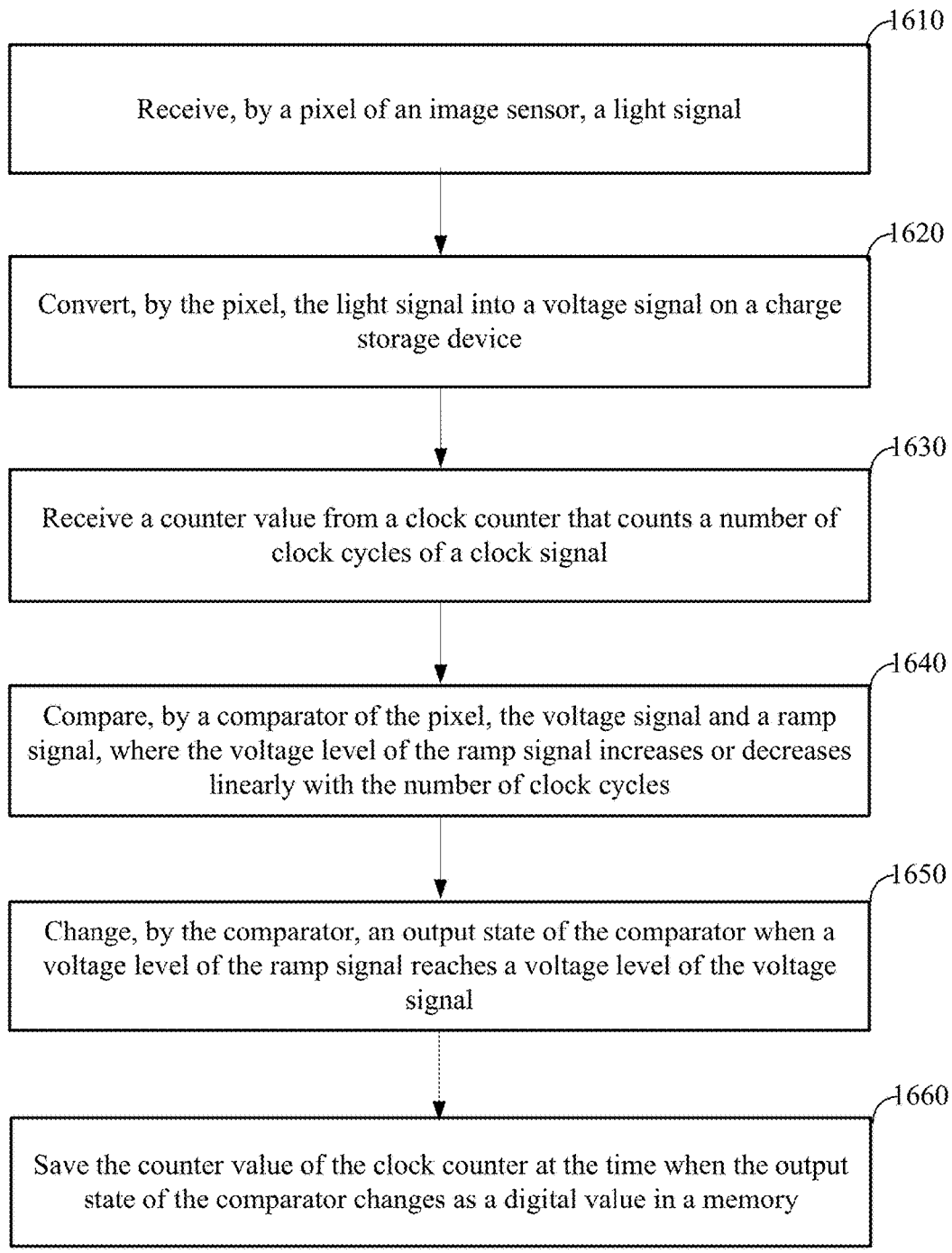
FIG. 16 is a flow chart illustrating an example method of digital imaging, according to certain embodiments.

FIG. 16 is a flow chart illustrating an example method of digital imaging, according to certain embodiments. The method may be performed by, for example, digital pixel image sensor 600 and/or digital pixel 700, 900, 1000, or 1100. The method may be used to capture digital image frames at a high frame rate with a high sensitivity, a low noise level, and a low power consumption. The method may be performed by all digital pixels in a digital pixel image sensor in parallel.

At block 1610, a photodiode of a pixel in an image sensor may receive a light signal during an exposure period. In some implementations, before or during receiving the light signal, the photodiode of the pixel may be reset by, for example, an electric shutter signal that controls the resetting of the photodiodes of all pixels in the image sensor. Therefore, the photodiodes of all pixels in the image sensor may be reset simultaneously by the same electric shutter signal (i.e., a global electronic shutter). The photodiode may be reset to a DC voltage level, such as 0 V to discharge all charges at a parasitic capacitor associated with the photodiode. In some implementations, a charge storage device (i.e., a measurement capacitor), such as an explicit or parasitic capacitor (e.g., a floating diffusion node), may also be reset. In some implementations, the photodiode of the pixel may be reset by a reset signal (e.g., reset signal 720 or RST signal in FIG. 10) and a transfer gate control signal (e.g., measurement control signal 708 or TX signal in FIG. 10) through a reset switch (e.g., reset switch 718 or reset gate 1040) and a transfer gate (e.g., transfer gate 704 or 1020).

At block 1620, the pixel may convert the light signal into a voltage level on the charge storage device (e.g., a FD node). During the exposure period, the photodiode may be disconnected from the charge storage device by, for example, turning off the transfer gate. The photodiode may generate charges (e.g., photoelectrons or holes) or photo currents in response to receiving the light signal. For example, for a brighter light signal, the photodiode may generate a larger photo current and thus more charges. The charges generated by the photodiode during the exposure period may accumulate at or be integrated by an integration capacitor. In some implementations, the integration capacitor may be a parasitic capacitor associated with the photodiode and/or circuits connected to the photodiode. After the exposure period, the charge storage device may be connected to the photodiode by, for example, turning on the transfer gate, to transfer at least a portion or all of the accumulated charges from the integration capacitor to the charge storage device. In some implementations, the charge storage device may be reset before the end of the exposure period, such as at 100 µs before the end of the exposure period. The transferred charges may cause a development of a voltage signal (or voltage level change) on the charge storage device (e.g., measurement capacitor 706 or FD capacitor 1030). The voltage signal level may correlate with the quantity of charges stored on the charge storage device, and thus may also correlate with the brightness or intensity of the light signal. The voltage signal level may also depend on the capacitance of the charge storage device. After the charge transfer, the charge storage device may be disconnected from the photodiode by, for example, turning off the transfer gate.

At block 1630, the pixel (more specifically, a comparator in a digitizer of the pixel) may receive a counter value from a clock counter that counts the number of clock cycles of a clock signal. The clock counter may be a global clock counter that provides counter values to multiple or all pixels of the image sensor. The clock counter may begin to count the number of clock cycles when a digitization period starts, and may be reset to a default value (e.g., 0 or a number greater than 0) before the digitization period starts or after the digitization period ends.

At block 1640, the comparator of the pixel may compare the voltage level on the charge storage device and a ramp signal. The voltage level of the ramp signal may increase (i.e., for ramping up) or decrease (i.e., for ramping down) linearly as the number of clock cycles increases. In some embodiments, the ramp signal may be generated by a global reference signal generator. For example, in some implementations, the ramp signal may be generated by a DAC using the counter values of the clock counter (the numbers of clock cycles counted) as inputs, and may be used by the comparators of multiple or all pixels of the image sensor as a reference signal. The voltage level on the charge storage device may be sensed (e.g., using a selection signal) and amplified (e.g., by a source follower amplifier or a buffer as described above) before being sent to the comparator. When the ramp signal is lower (or higher for a ramping down signal) than the sensed (and amplified) voltage level from the charge storage device, the output of the comparator may be at a low level (or a high level in some implementations). The ramp signal may gradually increase (or decrease for a ramping down signal) with the increasing number of clock cycles.

At block 1650, at a time when the ramp signal reaches a level equal to or greater (or lower for a ramping down signal) than (e.g., by a threshold voltage of a transistor) the sensed voltage level from the charge storage device, the output of the comparator may change states, for example, flipping or toggling from a low level to a high level.

At block 1660, the counter value of the clock counter at the time when the output state of the comparator changes (e.g., flips or toggles) may be save as a first digital value, for example, in an n-bit block in a pixel memory. The first digital value may correspond to the intensity of the light signal at the pixel. The first digital value for each pixel of the image sensor may be read out line by line to form a digital image frame.

In some implementations, after the charge storage device is reset at a time before the end of the exposure period, the voltage level of the charge storage device may be digitized to a second digital value using the comparator, the clock counter, and a second ramp signal generated by the reference signal generator, in a manner similar to the manner that the voltage level associated with the light signal is digitized. The difference between the first digital value and the second digital value may be a more accurate representation of the intensity of the light signal at the pixel.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Figure 17:
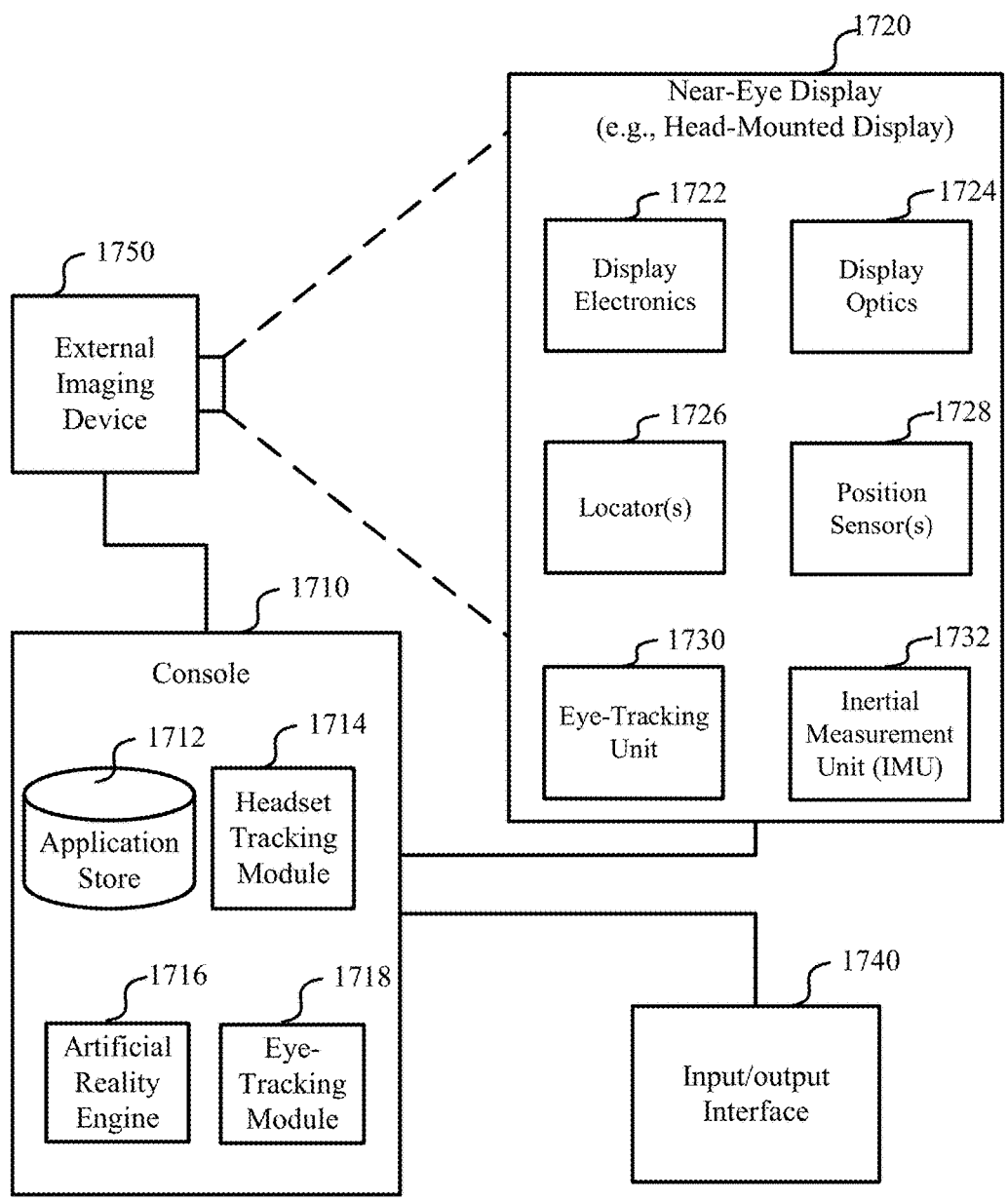
FIG. 17 is a simplified block diagram of an example artificial reality system environment including a near-eye display that may implement some of the examples disclosed herein.

FIG. 17 is a simplified block diagram of an example artificial reality system environment 1700 including a near-eye display 1720, in accordance with certain embodiments. Artificial reality system environment 1700 shown in FIG. 17 may include near-eye display 1720, an external imaging device 1750, and an input/output interface 1740 that are each coupled to a console 1710. While FIG. 17 shows example artificial reality system environment 1700 including one near-eye display 1720, one external imaging device 1750, and one input/output interface 1740, any number of these components may be included in artificial reality system environment 1700, or any of the components may be omitted. For example, there may be multiple near-eye displays 1720 monitored by one or more external imaging devices 1750 in communication with console 1710. In alternative configurations, different or additional components may be included in artificial reality system environment 1700.

Near-eye display 1720 may be a head-mounted display (HMD) that presents content to a user. Examples of content presented by near-eye display 1720 include one or more of images, videos, audios, or some combination thereof. In some embodiments, audios may be presented via an external device (e.g., speakers and/or headphones) that receives audio information from near-eye display 1720, console 1710, or both, and presents audio data based on the audio information. Near-eye display 1720 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 1720 may be implemented in any suitable form factor, including a pair of glasses. Some embodiments of near-eye display 1720 are further described below with respect to FIGS. 2 and 3. Additionally, in various embodiments, the functionality described herein may be used in a headset that optically or electrically combines images of an environment external to near-eye display 1720 and content received from console 1710, or from any other console generating and providing content to a user. Therefore, near-eye display 1720 may augment images of a physical, real-world environment external to near-eye display 1720 with generated content (e.g., images, video, sound, etc.) to present an augmented reality to a user.

In various embodiments, near-eye display 1720 may include one or more of display electronics 1722, display optics 1724, one or more locators 1726, one or more position sensors 1728, an eye-tracking unit 1730, and an inertial measurement unit (IMU) 1732. Near-eye display 1720 may omit any of these elements or include additional elements in various embodiments. Additionally, in some embodiments, near-eye display 1720 may include elements combining the function of various elements described in conjunction with FIG. 17.

Display electronics 1722 may display images to the user according to data received from console 1710. In various embodiments, display electronics 1722 may include circuits for generating images of virtual or real objects, and/or circuits for driving some components of display optics 1724, such as electrically steerable mirrors described in detail below. In some embodiments, display electronics 1722 may include one or more display panels, such as a liquid crystal display (LCD), a liquid-crystal on silicon (LCOS) display, an organic light emitting diode (OLED) display, a micro light emitting diode (mLED) display, an active-matrix OLED display (AMOLED), a transparent OLED display (TOLED), digital micro-mirror device (DMD), or some other display. In one implementation of near-eye display 1720, display electronics 1722 may include a TOLED panel which may include sub-pixels to emit light of a predominant color such as red, green, blue, white, or yellow. In some implementations, display electronics 1722 may display a 3D image through stereo effects produced by two-dimensional panels to create a subjective perception of image depth. For example, display electronics 1722 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 1724 may display image content optically (e.g., using optical waveguides and couplers), or magnify image light received from display electronics 1722, correct optical errors associated with the image light, combine image light from display electronics 1722 and the environment, and present the corrected and combined image light to a user of near-eye display 1720. In various embodiments, display optics 1724 may include one or more optical elements. Example optical elements may include a substrate, optical waveguides, an aperture, a Fresnel lens, a convex lens, a concave lens, a filter, a mirror, a diffractive optical element (DOE), or any other suitable optical element that may affect image light emitted from display electronics 1722 and the environment. Display optics 1724 may include a combination of different optical elements as well as mechanical couplings to maintain relative spacing and orientation of the optical elements in the combination. One or more optical elements in display optics 1724 may have an optical coating, such as an anti-reflective coating, a reflective coating, a filtering coating, or a combination of different optical coatings.

Magnification of the image light by display optics 1724 may allow display electronics 1722 to be physically smaller, weigh less, and consume less power than larger displays. Additionally, magnification may increase a field of view of the displayed content. In some embodiments, display optics 1724 may have an effective focal length larger than the spacing between display optics 1724 and display electronics 1722 to magnify image light projected by display electronics 1722. The amount of magnification of image light by display optics 1724 may be adjusted by adding or removing optical elements from display optics 1724.

Display optics 1724 may be designed to correct one or more types of optical errors, such as two-dimensional optical errors, three-dimensional optical errors, or a combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism. In some embodiments, content provided to display electronics 1722 for display may be pre-distorted, and display optics 1724 may correct the distortion when it receives image light from display electronics 1722 generated based on the pre-distorted content.

Locators 1726 may be objects located in specific positions on near-eye display 1720 relative to one another and relative to a reference point on near-eye display 1720. Console 1710 may identify locators 1726 in images captured by external imaging device 1750 to determine the artificial reality headset's position, orientation, or both. A locator 1726 may be a light emitting diode (LED), a corner cube reflector, a reflective marker, a type of light source that contrasts with an environment in which near-eye display 1720 operates, or some combinations thereof. In embodiments where locators 1726 are active components (e.g., LEDs or other types of light emitting devices), locators 1726 may emit light in the visible band (e.g., about 380 nm to 750 nm), in the infrared (IR) band (e.g., about 750 nm to 17 mm), in the ultraviolet band (e.g., about 170 nm to about 380 nm), in another portion of the electromagnetic spectrum, or in any combination of portions of the electromagnetic spectrum.

External imaging device 1750 may generate slow calibration data based on calibration parameters received from console 1710. Slow calibration data may include one or more images showing observed positions of locators 1726 that are detectable by external imaging device 1750. External imaging device 1750 may include one or more cameras, one or more video cameras, any other device capable of capturing images including one or more of locators 1726, or some combinations thereof. Additionally, external imaging device 1750 may include one or more filters (e.g., to increase signal to noise ratio). External imaging device 1750 may be configured to detect light emitted or reflected from locators 1726 in a field of view of external imaging device 1750. In embodiments where locators 1726 include passive elements (e.g., retroreflectors), external imaging device 1750 may include a light source that illuminates some or all of locators 1726, which may retro-reflect the light to the light source in external imaging device 1750. Slow calibration data may be communicated from external imaging device 1750 to console 1710, and external imaging device 1750 may receive one or more calibration parameters from console 1710 to adjust one or more imaging parameters (e.g., focal length, focus, frame rate, sensor temperature, shutter speed, aperture, etc.).

Position sensors 1728 may generate one or more measurement signals in response to motion of near-eye display 1720. Examples of position sensors 1728 may include accelerometers, gyroscopes, magnetometers, other motion-detecting or error-correcting sensors, or some combinations thereof. For example, in some embodiments, position sensors 1728 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 1732 may be an electronic device that generates fast calibration data based on measurement signals received from one or more of position sensors 1728. Position sensors 1728 may be located external to IMU 1732, internal to IMU 1732, or some combination thereof. Based on the one or more measurement signals from one or more position sensors 1728, IMU 1732 may generate fast calibration data indicating an estimated position of near-eye display 1720 relative to an initial position of near-eye display 1720. For example, IMU 1732 may integrate measurement signals received from accelerometers over time to estimate a velocity vector and integrate the velocity vector over time to determine an estimated position of a reference point on near-eye display 1720. Alternatively, IMU 1732 may provide the sampled measurement signals to console 1710, which may determine the fast calibration data. While the reference point may generally be defined as a point in space, in various embodiments, the reference point may also be defined as a point within near-eye display 1720 (e.g., a center of IMU 1732).

Eye-tracking unit 1730 may include one or more eye-tracking systems. An eye-tracking system may include an imaging system to image one or more eyes and may optionally include a light emitter, which may generate light that is directed to an eye such that light reflected by the eye may be captured by the imaging system. For example, eye-tracking unit 1730 may include a coherent light source (e.g., a laser diode) emitting light in the visible spectrum or infrared spectrum, and a camera capturing the light reflected by the user's eye. As another example, eye-tracking unit 1730 may capture reflected radio waves emitted by a miniature radar unit. Eye-tracking unit 1730 may use low-power light emitters that emit light at frequencies and intensities that would not injure the eye or cause physical discomfort. Eye-tracking unit 1730 may be arranged to increase contrast in images of an eye captured by eye-tracking unit 1730 while reducing the overall power consumed by eye-tracking unit 1730 (e.g., reducing power consumed by a light emitter and an imaging system included in eye-tracking unit 1730). For example, in some implementations, eye-tracking unit 1730 may consume less than 1700 milliwatts of power.

Eye-tracking unit 1730 may be configured to estimate the orientation of the user's eye. The orientation of the eye may correspond to the direction of the user's gaze within near-eye display 1720. The orientation of the user's eye may be defined as the direction of the foveal axis, which is the axis between the fovea (an area on the retina of the eye with the highest concentration of photoreceptors) and the center of the eye's pupil. In general, when a user's eyes are fixed on a point, the foveal axes of the user's two eyes intersect that point. The pupillary axis of an eye may be defined as the axis that passes through the center of the pupil and is perpendicular to the corneal surface. In general, even though the pupillary axis and the foveal axis intersect at the center of the pupil, the pupillary axis may not directly align with the foveal axis. Because the foveal axis is defined according to the fovea, which is located in the back of the eye, the foveal axis may be difficult or impossible to measure directly in some eye tracking embodiments. Accordingly, in some embodiments, the orientation of the pupillary axis may be detected and the foveal axis may be estimated based on the detected pupillary axis.

Near-eye display 1720 may use the orientation of the eye to, e.g., determine an inter-pupillary distance (IPD) of the user, determine gaze direction, introduce depth cues (e.g., blur the image outside of the user's main line of sight), collect heuristics on the user interaction in the artificial reality media (e.g., time spent on any particular subject, object, or frame as a function of exposed stimuli), some other functions that are based in part on the orientation of at least one of the user's eyes, or some combination thereof. Because the orientation may be determined for both eyes of the user, eye-tracking unit 1730 may be able to determine where the user is looking. For example, determining a direction of a user's gaze may include determining a point of convergence based on the determined orientations of the user's left and right eyes. A point of convergence may be the point where the two foveal axes of the user's eyes intersect (or the nearest point between the two axes). The direction of the user's gaze may be the direction of a line passing through the point of convergence and the mid-point between the pupils of the user's eyes.

Input/output interface 1740 may be a device that allows a user to send action requests to console 1710. An action request may be a request to perform a particular action. For example, an action request may be to start or to end an application or to perform a particular action within the application. Input/output interface 1740 may include one or more input devices. Example input devices may include a keyboard, a mouse, a game controller, a glove, a button, a touch screen, or any other suitable device for receiving action requests and communicating the received action requests to console 1710. An action request received by the input/output interface 1740 may be communicated to console 1710, which may perform an action corresponding to the requested action. In some embodiments, input/output interface 1740 may provide haptic feedback to the user in accordance with instructions received from console 1710. For example, input/output interface 1740 may provide haptic feedback when an action request is received, or when console 1710 has performed a requested action and communicates instructions to input/output interface 1740.

Console 1710 may provide content to near-eye display 1720 for presentation to the user in accordance with information received from one or more of external imaging device 1750, near-eye display 1720, and input/output interface 1740. In the example shown in FIG. 17, console 1710 may include an application store 1712, a headset tracking module 1714, an artificial reality engine 1716, and eye-tracking module 1718. Some embodiments of console 1710 may include different or additional modules than those described in conjunction with FIG. 17. Functions further described below may be distributed among components of console 1710 in a different manner than is described here.

In some embodiments, console 1710 may include a processor and a non-transitory computer-readable storage medium storing instructions executable by the processor. The processor may include multiple processing units executing instructions in parallel. The computer-readable storage medium may be any memory, such as a hard disk drive, a removable memory, or a solid-state drive (e.g., flash memory or dynamic random access memory (DRAM)). In various embodiments, the modules of console 1710 described in conjunction with FIG. 17 may be encoded as instructions in the non-transitory computer-readable storage medium that, when executed by the processor, cause the processor to perform the functions further described below.

Application store 1712 may store one or more applications for execution by console 1710. An application may include a group of instructions that, when executed by a processor, generates content for presentation to the user. Content generated by an application may be in response to inputs received from the user via movement of the user's eyes or inputs received from the input/output interface 1740. Examples of the applications may include gaming applications, conferencing applications, video playback applications, or other suitable applications.

Headset tracking module 1714 may track movements of near-eye display 1720 using slow calibration information from external imaging device 1750. For example, headset tracking module 1714 may determine positions of a reference point of near-eye display 1720 using observed locators from the slow calibration information and a model of near-eye display 1720. Headset tracking module 1714 may also determine positions of a reference point of near-eye display 1720 using position information from the fast calibration information. Additionally, in some embodiments, headset tracking module 1714 may use portions of the fast calibration information, the slow calibration information, or some combination thereof, to predict a future location of near-eye display 1720. Headset tracking module 1714 may provide the estimated or predicted future position of near-eye display 1720 to artificial reality engine 1716.

Headset tracking module 1714 may calibrate the artificial reality system environment 1700 using one or more calibration parameters, and may adjust one or more calibration parameters to reduce errors in determining the position of near-eye display 1720. For example, headset tracking module 1714 may adjust the focus of external imaging device 1750 to obtain a more accurate position for observed locators on near-eye display 1720. Moreover, calibration performed by headset tracking module 1714 may also account for information received from IMU 1732. Additionally, if tracking of near-eye display 1720 is lost (e.g., external imaging device 1750 loses line of sight of at least a threshold number of locators 1726), headset tracking module 1714 may re-calibrate some or all of the calibration parameters.

Artificial reality engine 1716 may execute applications within artificial reality system environment 1700 and receive position information of near-eye display 1720, acceleration information of near-eye display 1720, velocity information of near-eye display 1720, predicted future positions of near-eye display 1720, or some combination thereof from headset tracking module 1714. Artificial reality engine 1716 may also receive estimated eye position and orientation information from eye-tracking module 1718. Based on the received information, artificial reality engine 1716 may determine content to provide to near-eye display 1720 for presentation to the user. For example, if the received information indicates that the user has looked to the left, artificial reality engine 1716 may generate content for near-eye display 1720 that mirrors the user's eye movement in a virtual environment. Additionally, artificial reality engine 1716 may perform an action within an application executing on console 1710 in response to an action request received from input/output interface 1740, and provide feedback to the user indicating that the action has been performed. The feedback may be visual or audible feedback via near-eye display 1720 or haptic feedback via input/output interface 1740.

Eye-tracking module 1718 may receive eye-tracking data from eye-tracking unit 1730 and determine the position of the user's eye based on the eye tracking data. The position of the eye may include an eye's orientation, location, or both relative to near-eye display 1720 or any element thereof. Because the eye's axes of rotation change as a function of the eye's location in its socket, determining the eye's location in its socket may allow eye-tracking module 1718 to more accurately determine the eye's orientation.

In some embodiments, eye-tracking unit 1730 may output eye-tracking data including images of the eye, and eye-tracking module 1718 may determine the eye's position based on the images. For example, eye-tracking module 1718 may store a mapping between images captured by eye-tracking unit 1730 and eye positions to determine a reference eye position from an image captured by eye-tracking unit 1730. Alternatively or additionally, eye-tracking module 1718 may determine an updated eye position relative to a reference eye position by comparing an image from which the reference eye position is determined to an image from which the updated eye position is to be determined. Eye-tracking module 1718 may determine an eye position using measurements from different imaging devices or other sensors. For example, as described above, eye-tracking module 1718 may use measurements from a slow eye-tracking system to determine a reference eye position, and then determine updated positions relative to the reference eye position from a fast eye-tracking system until a next reference eye position is determined based on measurements from the slow eye-tracking system.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium," as used herein, refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A digital pixel image sensor, comprising:
   a single counter configured to generate count values;
   a plurality of pixels, each pixel of the plurality of pixels being coupled with the single counter and comprising:
      a photodiode configured to generate charges in response to an optical signal;
      a charge storage device configured to store the charges generated by the photodiode, the stored charges causing a voltage signal on the charge storage device;

a pixel memory; and
a digitizer comprising:
　a comparator configured to:
　　receive a ramp signal and an input signal related to the voltage signal, wherein a voltage level of the ramp signal increases or decreases after each cycle of a clock signal; and
　　generate a switching output based on determining that the voltage level of the ramp signal reaches a voltage level of the input signal; and
　a digital output generating circuit configured to, responsive to the switching output of the comparator, store a first count value of the count values received from the single counter in the pixel memory.

2. The digital pixel image sensor of claim 1,
wherein the first count value stored at the pixel memory of the each pixel of the plurality of pixels corresponds to a number of cycles of the clock signal elapsed between when the ramp signal starts and when the comparator of the each pixel generates the switching output and
wherein the first count values stored at the pixel memories of at least two pixels of the plurality of pixels are different.

3. The digital pixel image sensor of claim 2, further comprising a reference signal generator configured to:
generate the ramp signal based on the count values from the single counter; and
send the ramp signal to the plurality of pixels.

4. The digital pixel image sensor of claim 1, wherein the each pixel of the plurality of pixels further comprises:
a transfer gate coupled to the photodiode and the charge storage device,
wherein the photodiode is configured to accumulate the charges during an exposure time period; and
wherein the transfer gate is configured to:
　disconnect the photodiode from the charge storage device during the exposure time period;
　connect the photodiode to the charge storage device after the exposure time period to transfer the accumulated charges from the photodiode to the charge storage device; and
　disconnect the photodiode from the charge storage device after transferring the accumulated charges.

5. The digital pixel image sensor of claim 1, wherein the each pixel of the plurality of pixels further comprises:
a reset circuit configurable to reset the charge storage device to a reset voltage level.

6. The digital pixel image sensor of claim 5, wherein:
the ramp signal is a first ramp signal;
the switching output of the comparator is a first switching output of the comparator;
at the each pixel of the plurality of pixels:
the comparator is further configured to, after the charge storage device is reset:
　receive a second ramp signal, wherein a voltage level of the second ramp signal increases or decreases after each cycle of the clock signal; and
　generate a second switching output based on determining that the voltage level of the second ramp signal reaches the reset voltage level;
the digital output generating circuit is further configured to, responsive to the second switching output of the comparator, store a second count value of the count values received from the single counter in the pixel memory, the stored second count value corresponding to a digitized value of the reset voltage level; and
a difference between the stored first count value and the stored second count value corresponds to an intensity of the optical signal received at the each pixel of the plurality of pixels.

7. The digital pixel image sensor of claim 6, wherein the pixel memory comprises:
an M-bit memory block configured to store the second count value; and
an N-bit memory block configured to store the first count value, wherein N is larger than M.

8. The digital pixel image sensor of claim 6, wherein the each pixel of the plurality of pixels further comprises:
a transfer gate coupled to the photodiode and the charge storage device, the transfer gate configured to:
　disconnect the photodiode from the charge storage device during an exposure time period;
　connect the photodiode to the charge storage device after the exposure time period to transfer charges from the photodiode to the charge storage device; and
　disconnect the photodiode from the charge storage device after transferring the charges.

9. The digital pixel image sensor of claim 8, wherein:
the reset circuit of the each pixel of the plurality of pixels is configured to reset the charge storage device at an end of the exposure time period and before the transfer gate connects the photodiode to the charge storage device.

10. The digital pixel image sensor of claim 9, wherein the reset circuit of the each pixel of the plurality of pixels is configured to reset the charge storage device before the exposure period starts.

11. The digital pixel image sensor of claim 1, wherein the comparator comprises a pre-charge circuit coupled to an output node of the comparator, the pre-charge circuit configured to charge the output node of the comparator to a DC level.

12. The digital pixel image sensor of claim 11, wherein:
the comparator further comprises a p-channel metal-oxide-semiconductor (PMOS) transistor;
a gate of the PMOS transistor is coupled to the charge storage device;
a source of the PMOS transistor is configured to receive the ramp signal; and
the output node of the comparator is coupled to a drain of the PMOS transistor.

13. The digital pixel image sensor of claim 1, wherein the each pixel of the plurality of pixels further comprises a shutter gate, the shutter gates of the plurality of pixels controlled by a same exposure enable signal.

14. The digital pixel image sensor of claim 1, wherein:
the charge storage device is a first charge storage device;
the voltage signal of the first charge storage device is a first voltage signal;
the each pixel further includes a second charge storage device and a differential amplifier;
the second charge storage device is configured to store a second voltage signal representing a reset voltage level of the first charge storage device when the first charge storage device is reset;
the differential amplifier is configured to:
　generate the input signal representing a difference between the first voltage signal and the second voltage signal; and
　provide the input signal to the comparator.

15. The digital pixel image sensor of claim 1, wherein the input signal is the voltage signal of the charge storage device.

16. The digital pixel image sensor of claim 1, wherein the pixel memory of the each pixel comprises a latch device configured to, based on a state of an enable signal, perform one of: updating a stored value based on the received count values, or to maintain the stored value; and
wherein the each pixel comprises logic circuit to change the state of the enable signal based on the switching output of the comparator.

17. The digital pixel image sensor of claim 1, wherein the single counter is a first counter;
wherein the digital pixel image sensor further comprises a second counter not coupled with the plurality of pixels.

18. A digital pixel image sensor, comprising:
a single counter configured to generate count values;
a plurality of pixels, each pixel of the plurality of pixels being coupled with the single counter;
wherein a first pixel of the plurality of pixels comprises:
a photodiode configured to generate charges in response to an optical signal;
a charge storage device configured to store the charges generated by the photodiode, the stored charges causing a voltage signal on the charge storage device;
a pixel memory; and
a digitizer comprising:
a comparator configured to:
receive a first ramp signal and the voltage signal, wherein a voltage level of the first ramp signal increases or decreases after each cycle of a clock signal; and
generate a first switching output based on determining that the voltage level of the first ramp signal reaches a voltage level of the voltage signal; and
a digital output generating circuit configured to, responsive to the first switching output of the comparator, store a first count value of the count values received from the single counter in the pixel memory, the stored first count value corresponding to a digitized value of the voltage level of the voltage signal.

19. The digital pixel image sensor of claim 18,
wherein the first pixel further comprises a reset gate configurable to reset the charge storage device to a reset voltage level;
wherein the comparator is further configured to, after the charge storage device is reset:
receive a second ramp signal, wherein a voltage level of the second ramp signal increases or decreases after each cycle of the clock signal; and
generate a second switching output based on determining that the voltage level of the second ramp signal reaches the reset voltage level;
wherein the digital output generating circuit is further configured to, responsive to the second switching output of the comparator, store a second count value of the count values received from the single counter in the pixel memory, the stored second count value corresponding to a digitized value of the reset voltage level;
wherein a difference between the stored first count value and the stored second count value corresponds to an intensity of the optical signal.

20. A method comprising:
starting a single counter to output count values to a plurality of pixels of an image sensor;
exposing a photodiode of each pixel of the plurality of pixels to light during an exposure period;
controlling the each pixel to convert the light received by the photodiode of the each pixel into a voltage signal on a charge storage device of the each pixel;
controlling a comparator of the each pixel to compare the voltage signal with a ramp signal to generate a switching output, wherein a voltage level of the ramp signal increases or decreases linearly with a number of clock cycles, and wherein the switching output is generated based on the voltage level of the ramp signal reaching the voltage level of the voltage signal;
responsive to the switching output of the comparator, storing, at a pixel memory of the each pixel, a first count value of the count values received from the single counter, wherein the stored first count value corresponds to a digitized value of the voltage level of the voltage signal.

21. The method of claim 20, further comprising:
restarting the single counter;
at the each pixel:
disconnecting the charge storage device from the photodiode;
resetting the charge storage device to a DC voltage level;
comparing, by the comparator, the DC voltage level and a second ramp signal to generate a second switching output, wherein a voltage level of the second ramp signal increases or decreases linearly with the number of clock cycles, and wherein the second switching output is generated based on the voltage level of the second ramp signal reaching the DC voltage level; and
responsive to the second switching output, storing a second count value of the count values received from the single counter in the pixel memory.

22. The method of claim 21, wherein resetting the charge storage device to the DC voltage level comprises:
resetting the charge storage device to the DC voltage level at an end of the exposure period.

23. The method of claim 20, wherein converting the light into the voltage signal on the charge storage device comprises:
disconnecting the charge storage device from the photodiode;
generating, by the photodiode, charges in response to receiving the light during the exposure period;
accumulating the charges at the photodiode during the exposure period;
connecting, after the exposure period, the charge storage device to the photodiode to transfer the accumulated charges to the charge storage device, wherein the transferred charges cause the voltage signal on the charge storage device; and
disconnecting the charge storage device from the photodiode.

24. The method of claim 20, further comprising, at the each pixel:
resetting the photodiode and the charge storage device before the exposure period.

25. The method of claim 20, further comprising, at the each pixel, before comparing the voltage signal and the ramp signal:
connecting an output node of the comparator to a DC voltage source to pre-charge the output node of the comparator; and disconnecting the output node of the comparator from the DC voltage source.

* * * * *